(12) United States Patent
Tashiro et al.

(10) Patent No.: US 9,791,306 B2
(45) Date of Patent: Oct. 17, 2017

(54) THERMAL TYPE FLOWMETER

(71) Applicant: HITACHI AUTOMOTIVE SYSTEM, LTD., Hitachinaka-shi, Ibaraki (JP)

(72) Inventors: Shinobu Tashiro, Hitachinaka (JP); Noboru Tokuyasu, Hitachinaka (JP); Tsutomu Kono, Tokyo (JP); Takeshi Morino, Hitachinaka (JP); Tsubasa Watanabe, Tokyo (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 130 days.

(21) Appl. No.: 14/778,278

(22) PCT Filed: Jan. 20, 2014

(86) PCT No.: PCT/JP2014/050881
§ 371 (c)(1),
(2) Date: Sep. 18, 2015

(87) PCT Pub. No.: WO2014/148080
PCT Pub. Date: Sep. 25, 2014

(65) Prior Publication Data
US 2016/0282163 A1    Sep. 29, 2016

(30) Foreign Application Priority Data

Mar. 21, 2013  (JP) .................................. 2013-059187

(51) Int. Cl.
*G01F 1/684* (2006.01)
*G01F 1/696* (2006.01)
(Continued)

(52) U.S. Cl.
CPC ............ *G01F 1/696* (2013.01); *G01F 1/6842* (2013.01); *G01F 1/692* (2013.01); *G01F 5/00* (2013.01);
(Continued)

(58) Field of Classification Search
CPC ........ G01F 1/6642; G01F 1/692; G01F 1/696; G01F 5/00; H01K 3/305; H01L 21/565;
(Continued)

(56) References Cited

U.S. PATENT DOCUMENTS 4,677,850 A * 7/1987 Miura ..................... G01F 1/684
73/204.15
4,912,975 A * 4/1990 Ohta ..................... F02D 41/187
73/204.26
(Continued)

FOREIGN PATENT DOCUMENTS

EP    2 837 918 A1    2/2015
JP        2784286        8/1998
(Continued)

OTHER PUBLICATIONS

The Extended European Search Report issued on Nov. 18, 2016 in the EP Application No. 14767545.8.

*Primary Examiner* — Carl Arbes
(74) *Attorney, Agent, or Firm* — Volpe and Koenig, P.C.

(57) ABSTRACT

In order to provide a method of manufacturing a thermal type flowmeter that is capable of reducing deformation of a semiconductor chip, which is caused by molding, a method of manufacturing a thermal type flowmeter is provided that includes a circuit package of a resin-molded semiconductor chip. The method includes resin-molding the semiconductor chip in a state in which a mold is pressed against a heat transfer surface that is provided on a surface of the semiconductor chip and a pressed surface that is set on the surface of the semiconductor chip at a position separate from the heat transfer surface.

9 Claims, 22 Drawing Sheets

(51) Int. Cl.
*G01F 1/692* (2006.01)
*G01F 5/00* (2006.01)
*H05K 3/30* (2006.01)
*H01L 21/56* (2006.01)

(52) U.S. Cl.
CPC ............ *H01L 21/565* (2013.01); *H05K 3/305* (2013.01); *H01L 2224/48137* (2013.01); *H01L 2224/73265* (2013.01); *H01L 2924/181* (2013.01); *H01L 2924/1815* (2013.01)

(58) Field of Classification Search
CPC . H01L 2224/48137; H01L 2224/73265; H01L 2924/181; H01L 2924/1815
See application file for complete search history.

(56) References Cited

U.S. PATENT DOCUMENTS

| | | | |
|---|---|---|---|
| 5,396,795 A | 3/1995 | Araki | |
| 6,516,785 B1 * | 2/2003 | Nakada | G01F 1/684 |
| | | | 123/494 |
| 6,588,268 B1 * | 7/2003 | Yamagishi | G01F 1/68 |
| | | | 73/204.26 |
| 7,255,837 B2 * | 8/2007 | Abe | G01F 1/684 |
| | | | 422/51 |
| 7,757,553 B2 * | 7/2010 | Meier | G01F 1/6842 |
| | | | 73/204.22 |
| 8,640,538 B2 | 2/2014 | Kono et al. | |
| 8,677,811 B2 | 3/2014 | Tagawa et al. | |
| 8,969,977 B2 | 3/2015 | Kono et al. | |
| 2007/0132080 A1 | 6/2007 | Nakashima et al. | |
| 2008/0148842 A1 | 6/2008 | Oda | |

FOREIGN PATENT DOCUMENTS

| | | |
|---|---|---|
| JP | 2009-036641 A | 2/2009 |
| JP | 2011-119500 A | 6/2011 |
| JP | 2011-122984 A | 6/2011 |
| JP | 2011-252796 A | 12/2011 |
| WO | 2012/049934 A1 | 4/2012 |

* cited by examiner

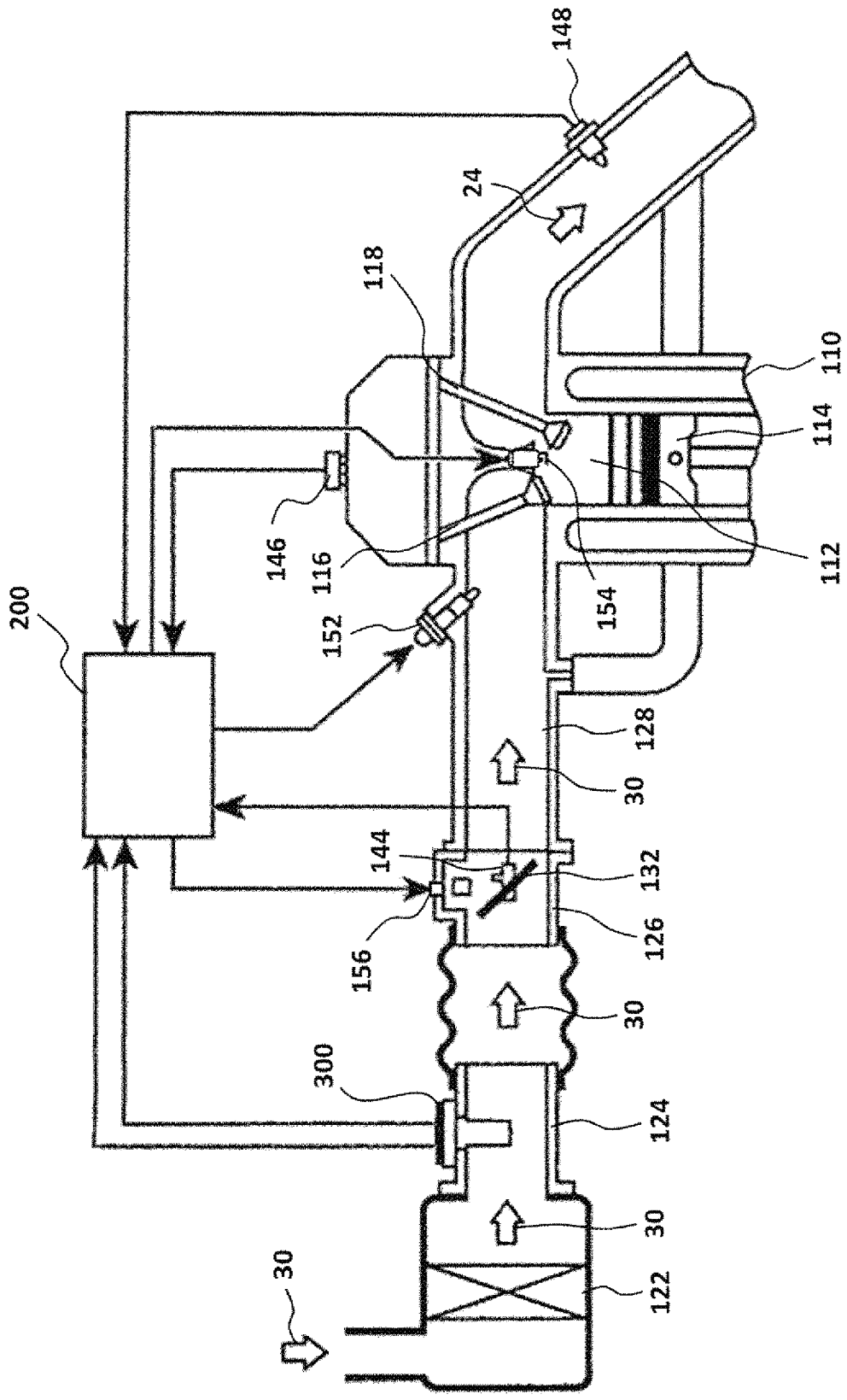
[Fig. 1]

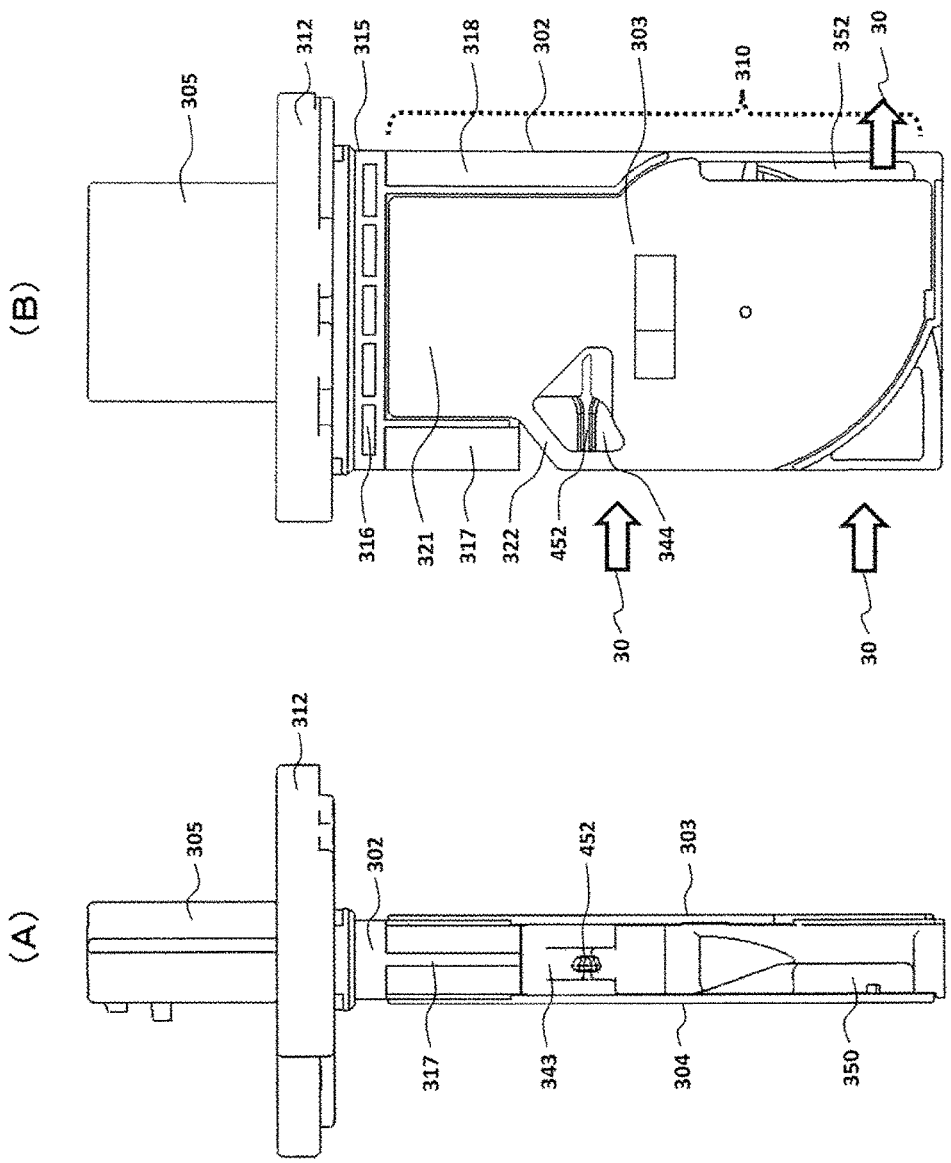
[Fig. 2]

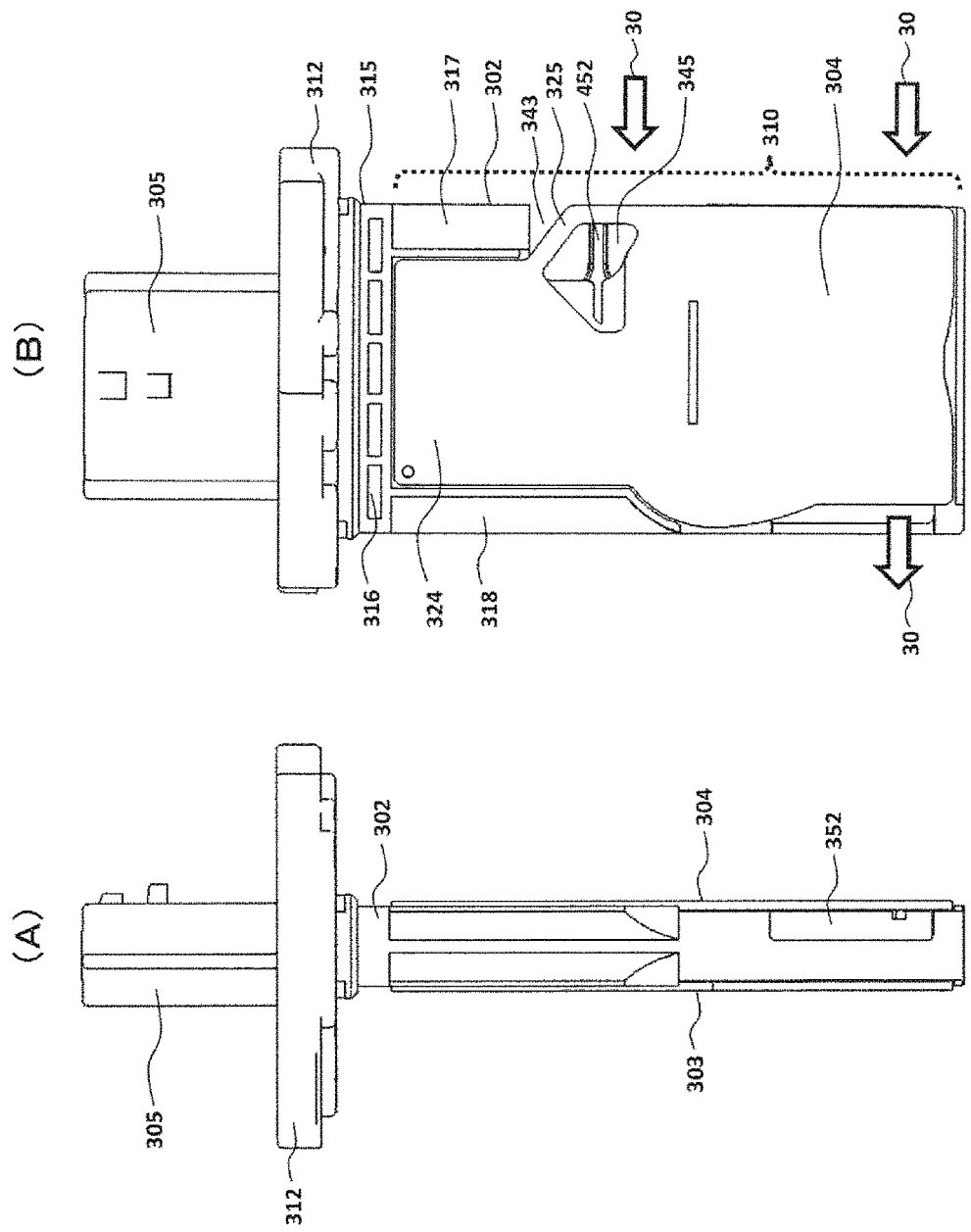

[Fig. 4]
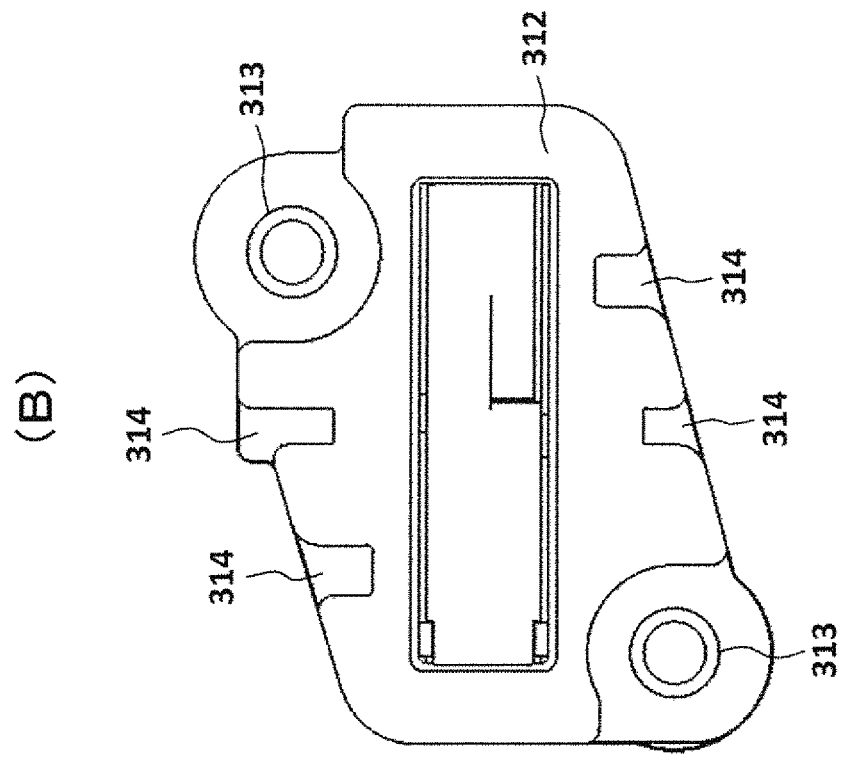
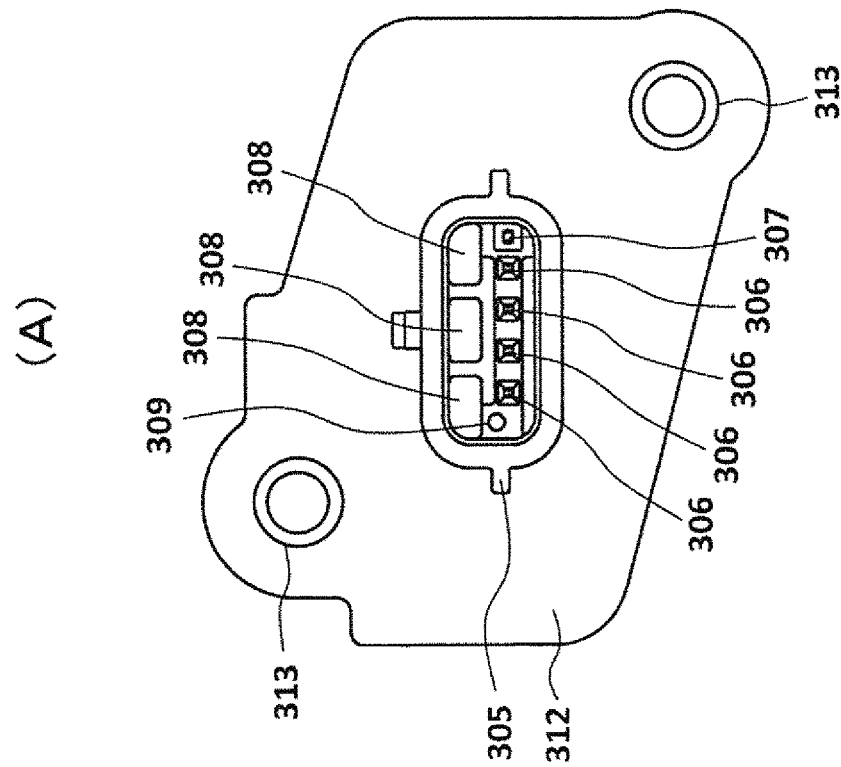

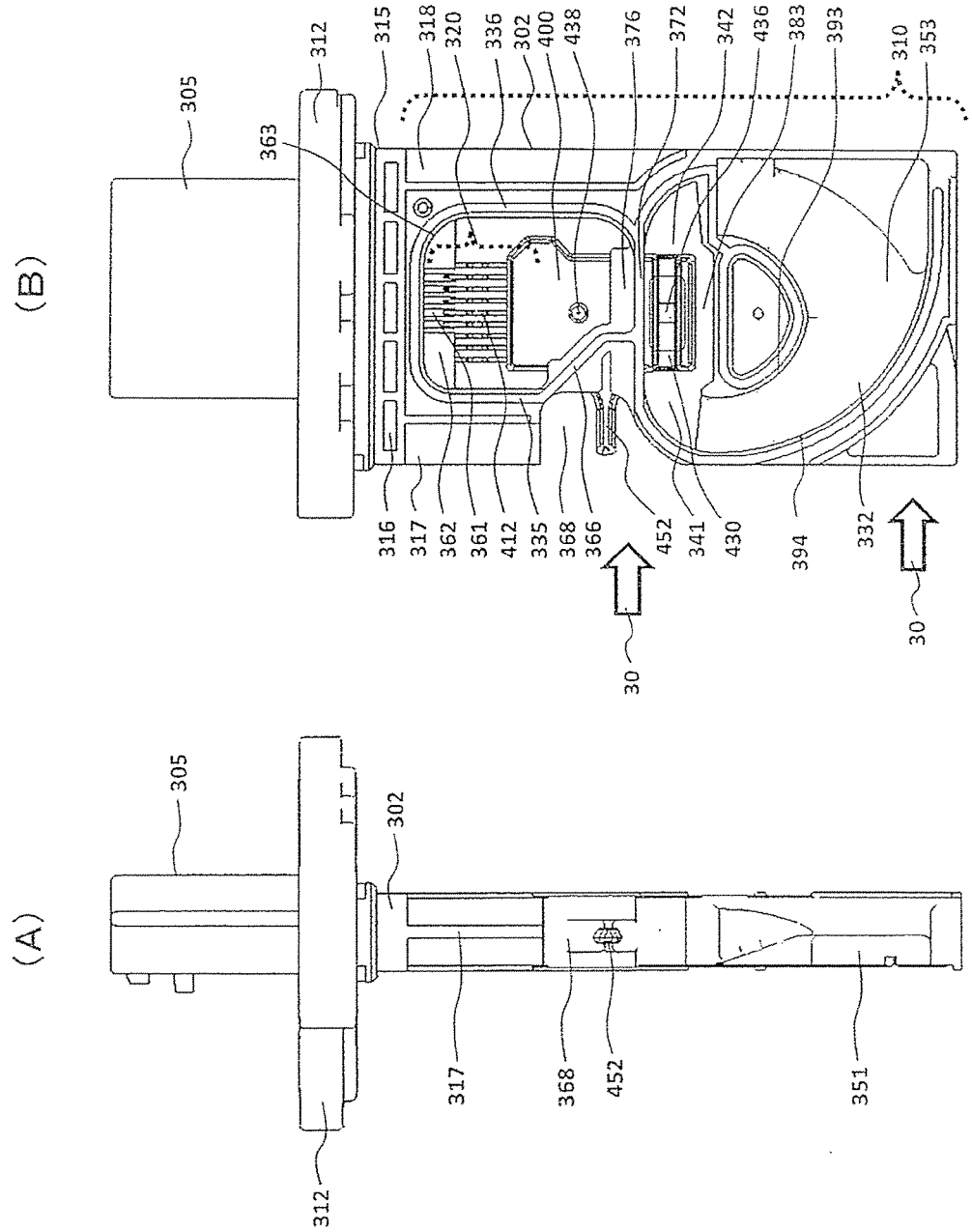
[Fig. 5]

[Fig. 6]
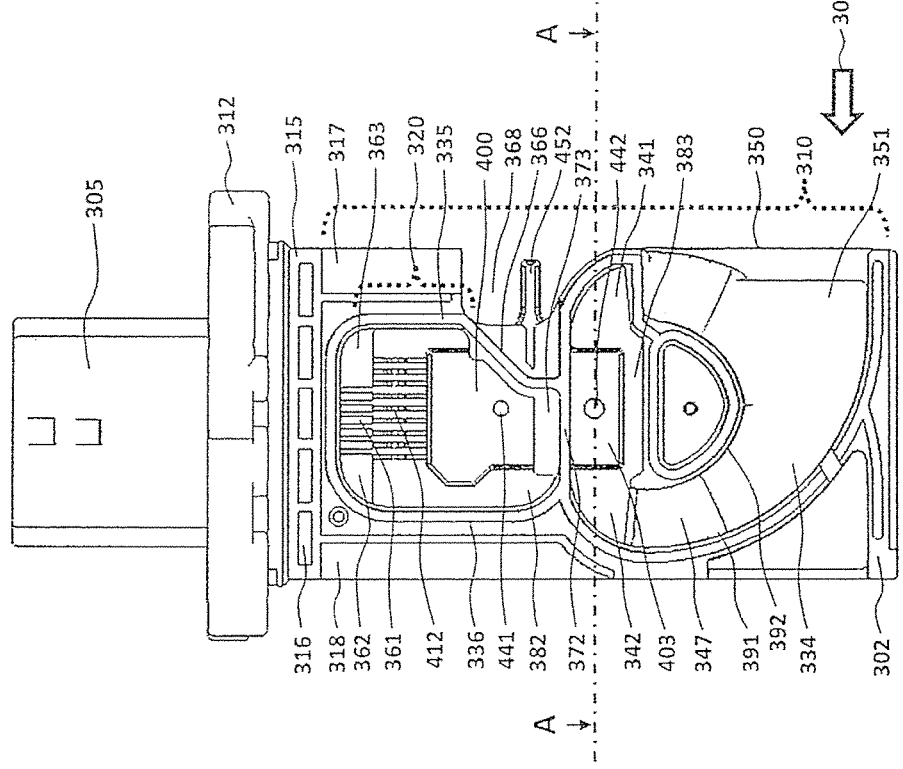
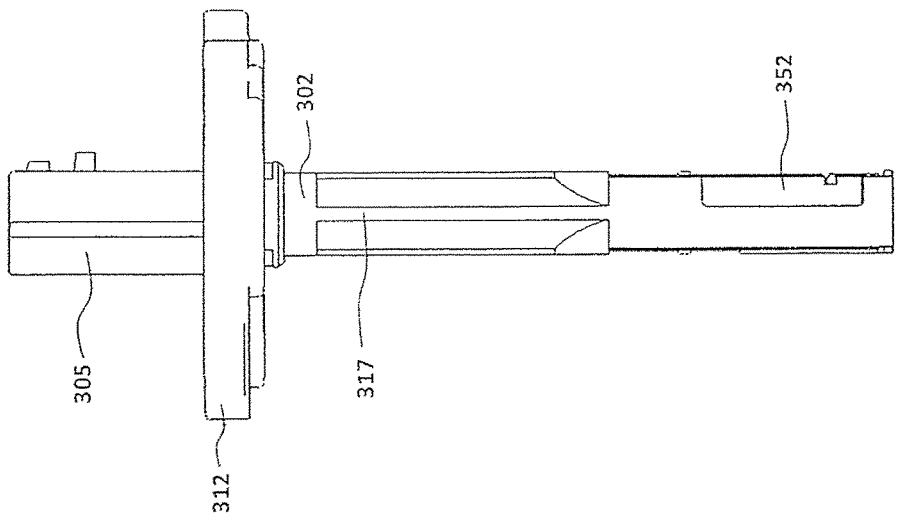

[Fig. 7]
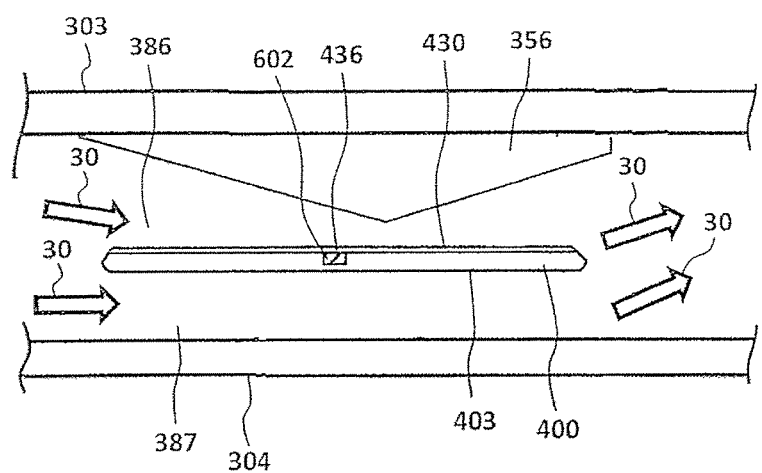

[Fig. 8]
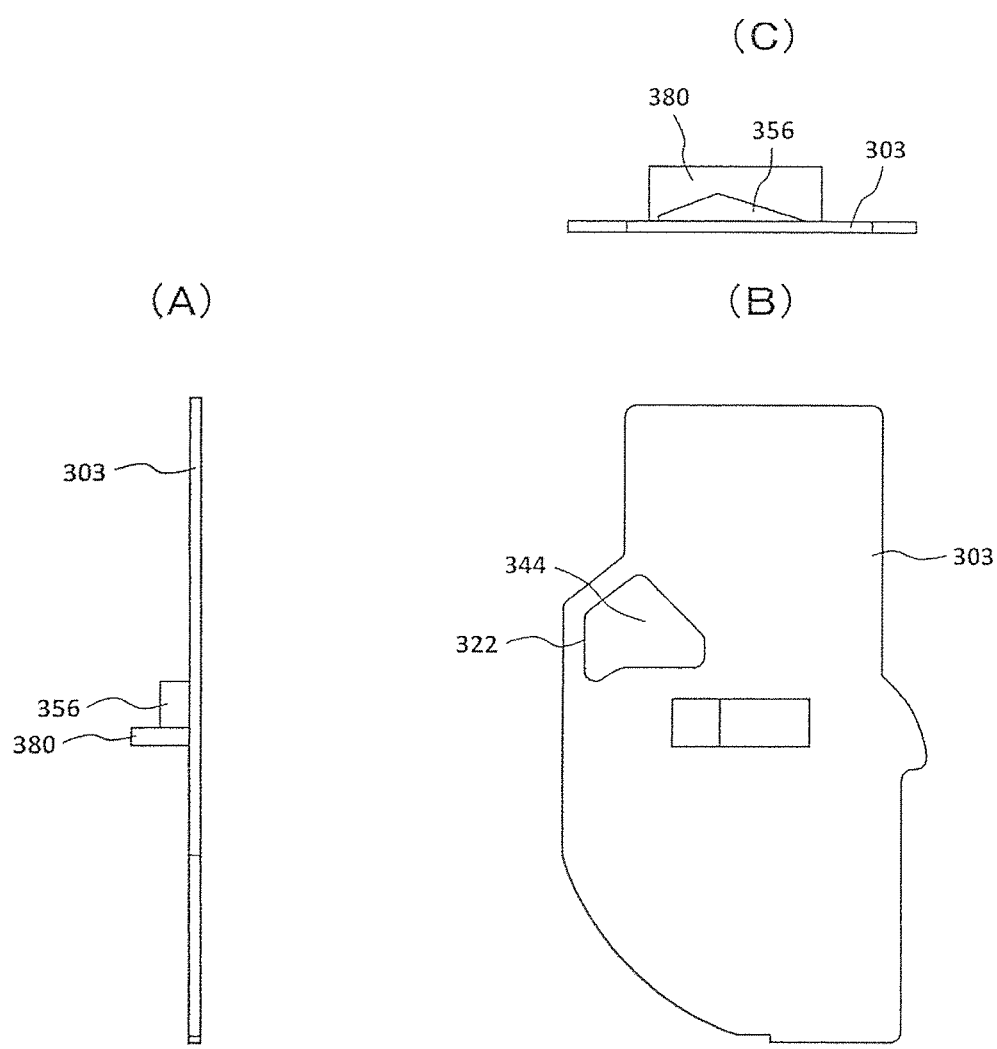

[Fig. 9]
(C)
(A) (B)
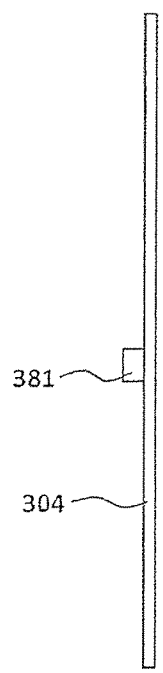 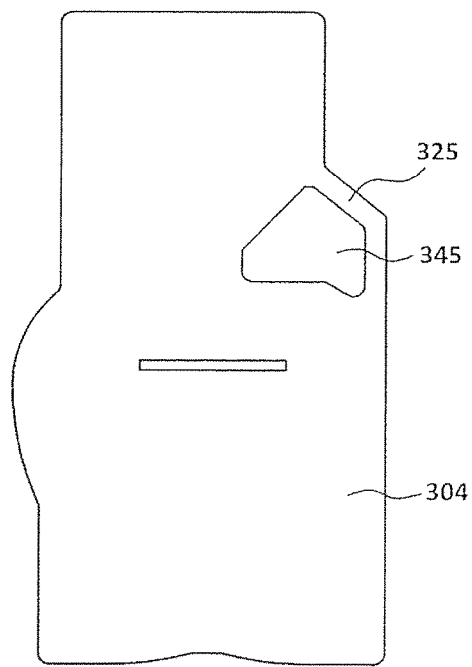

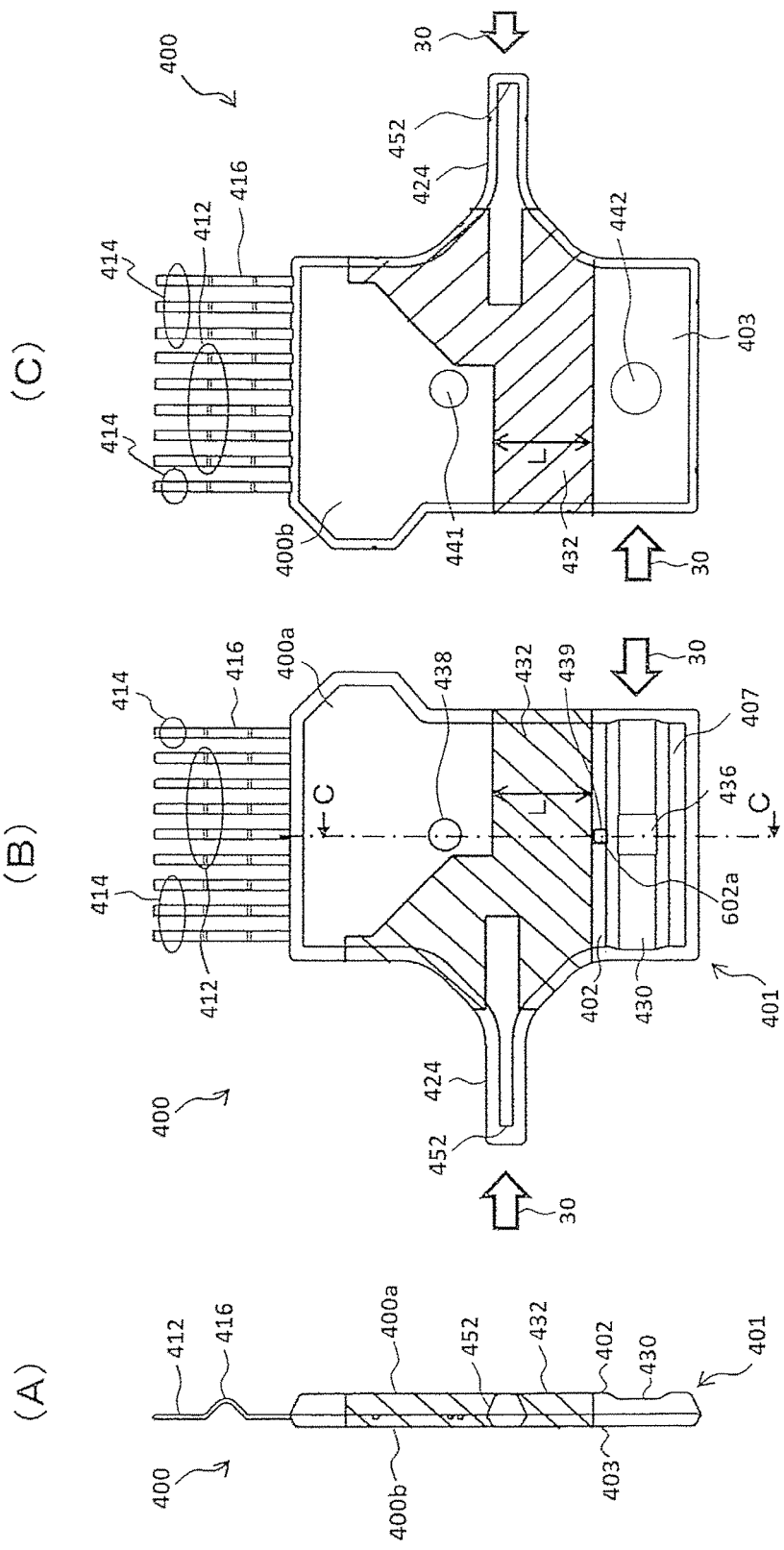

[Fig. 11]
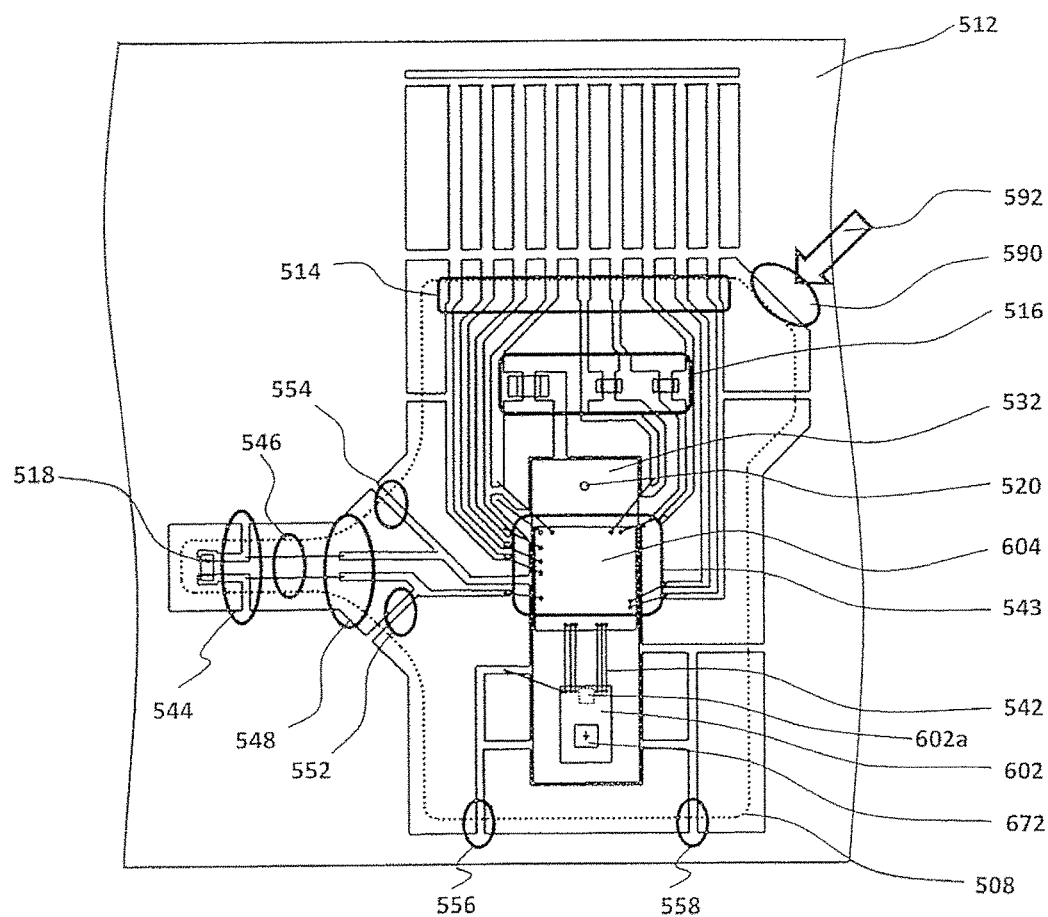

[Fig. 12]
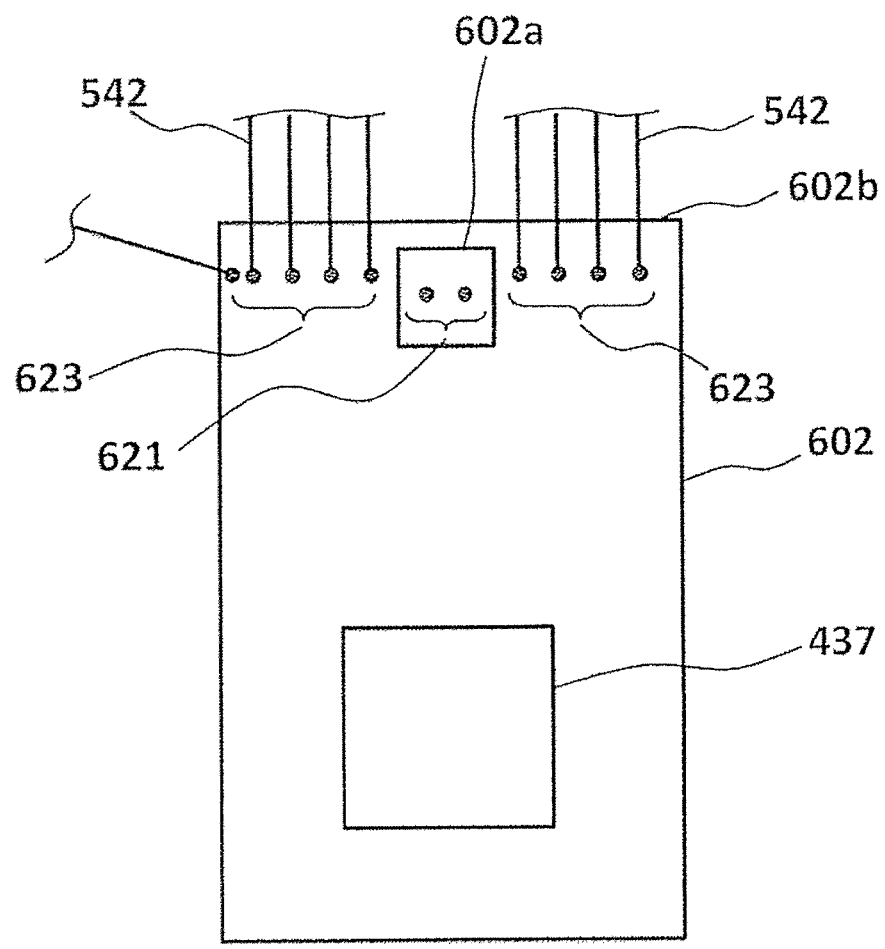

[Fig. 13]
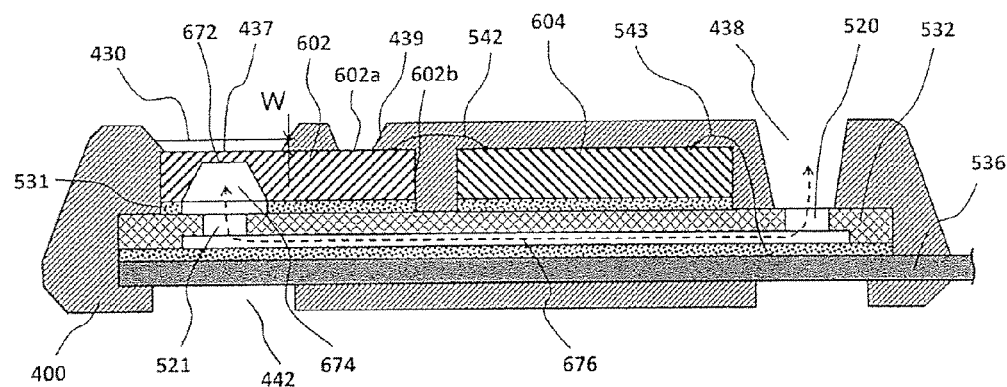
CROSS-SECTIONAL VIEW TAKEN ALONG C-C LINE

[Fig. 14]
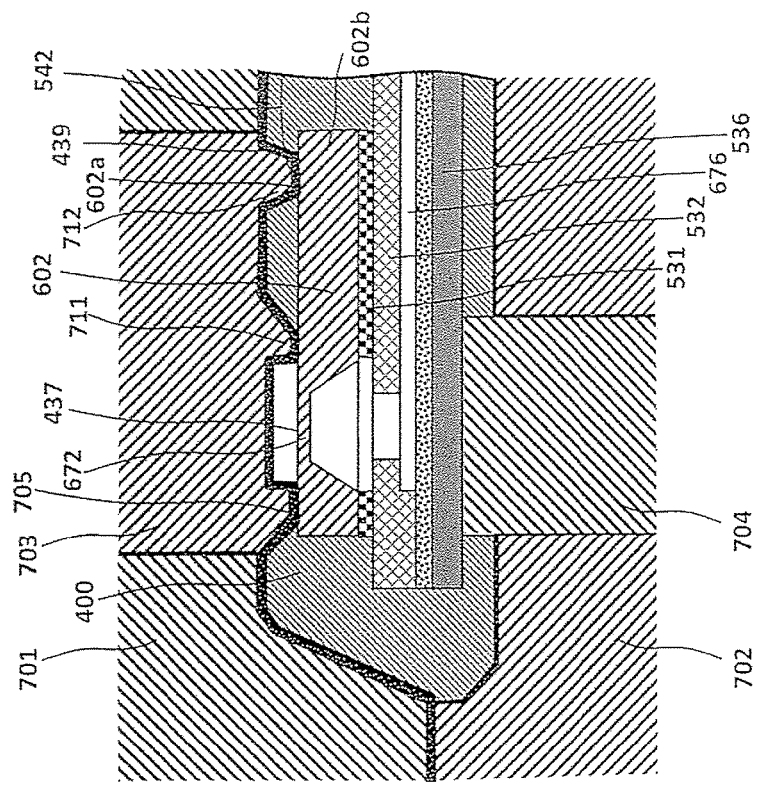
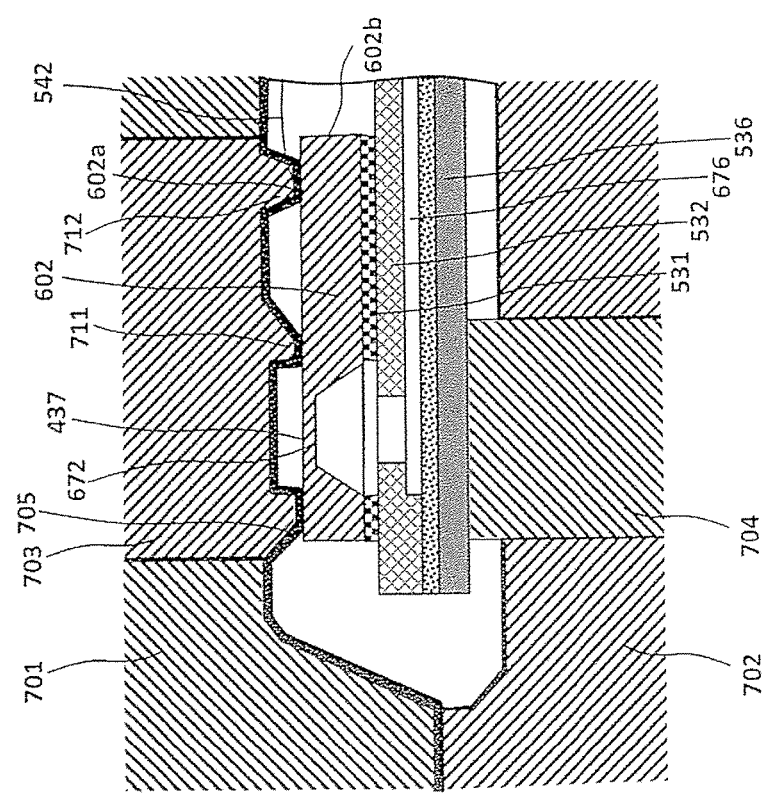

[Fig. 15-1]
(A)
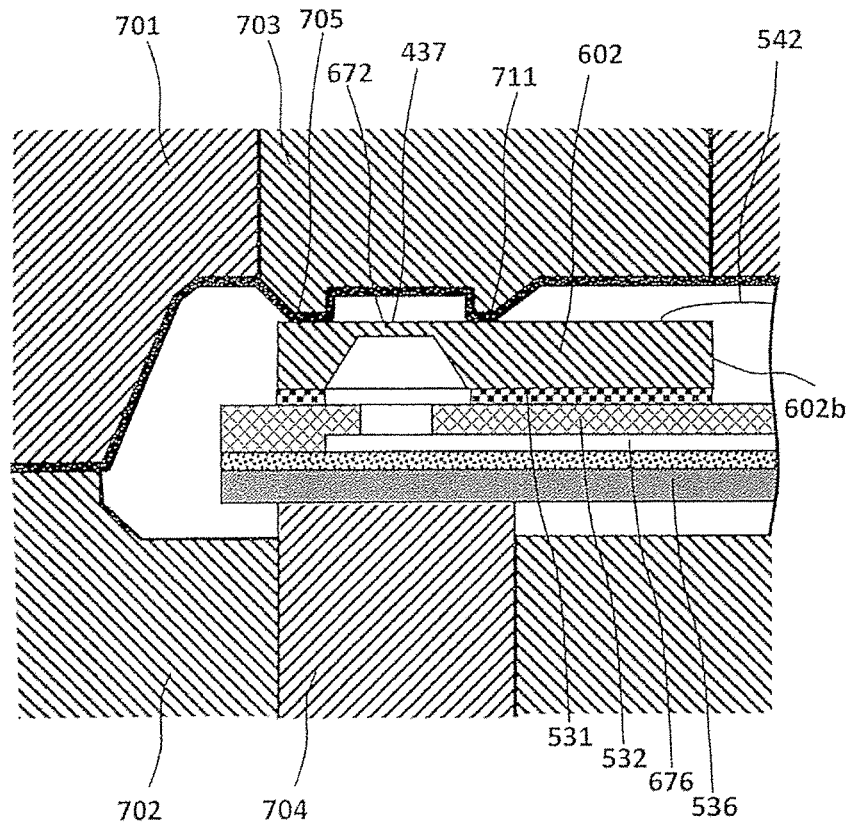

[Fig. 15-2]
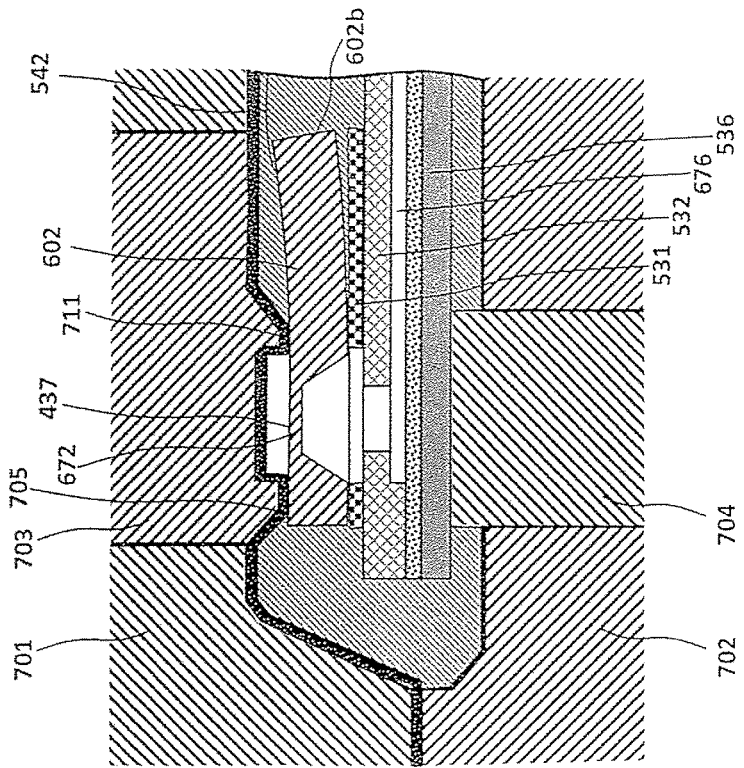
(B)
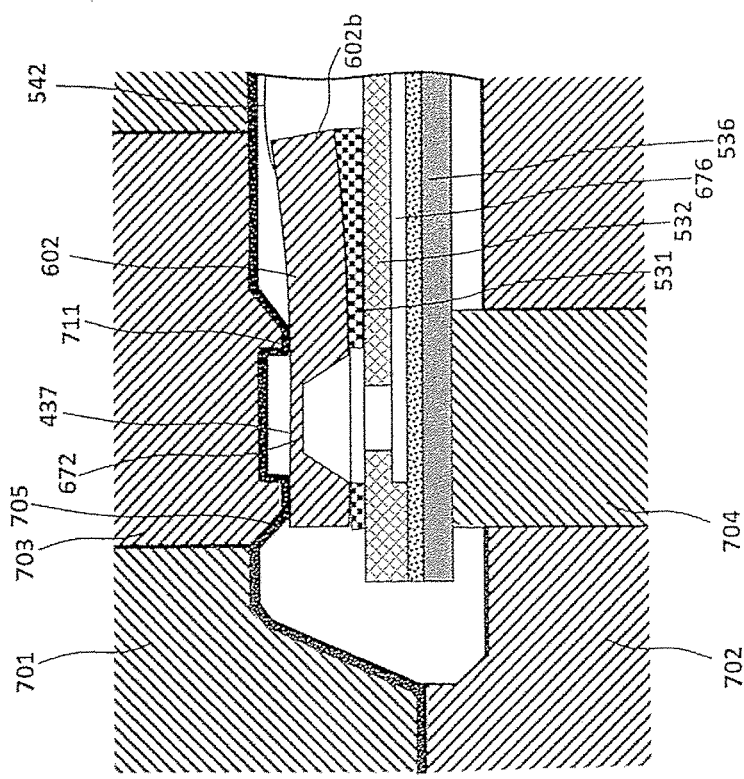
(C)

[Fig. 16]
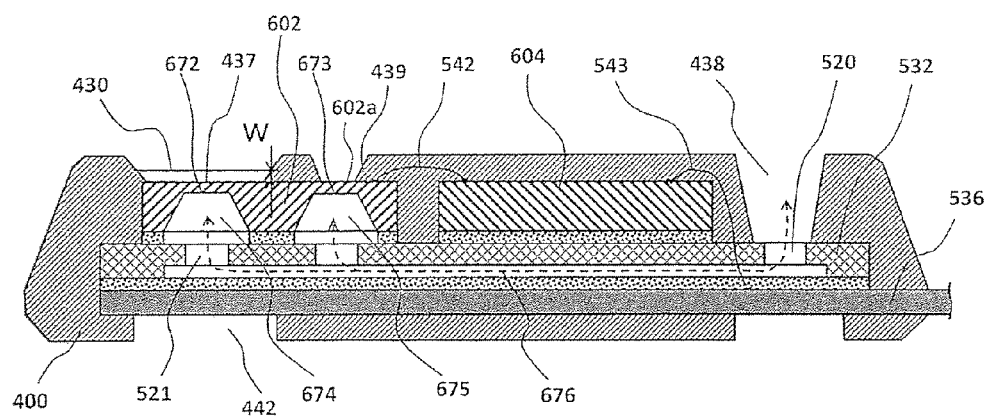
[Fig. 17]
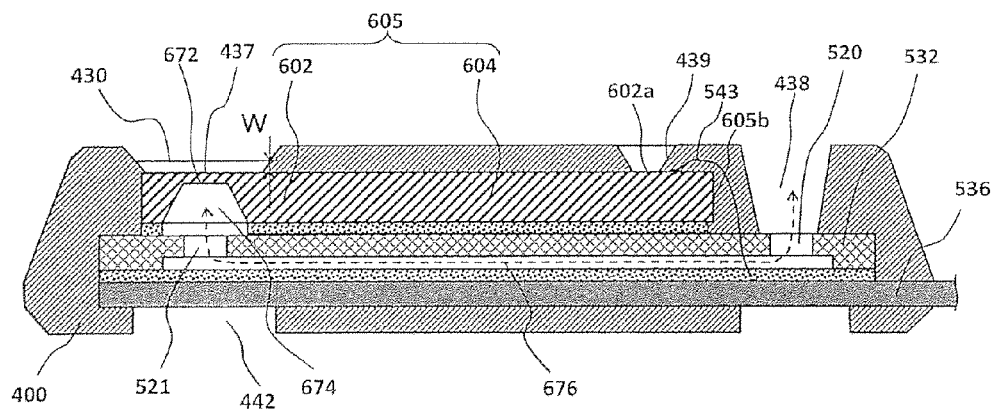

[Fig. 18]
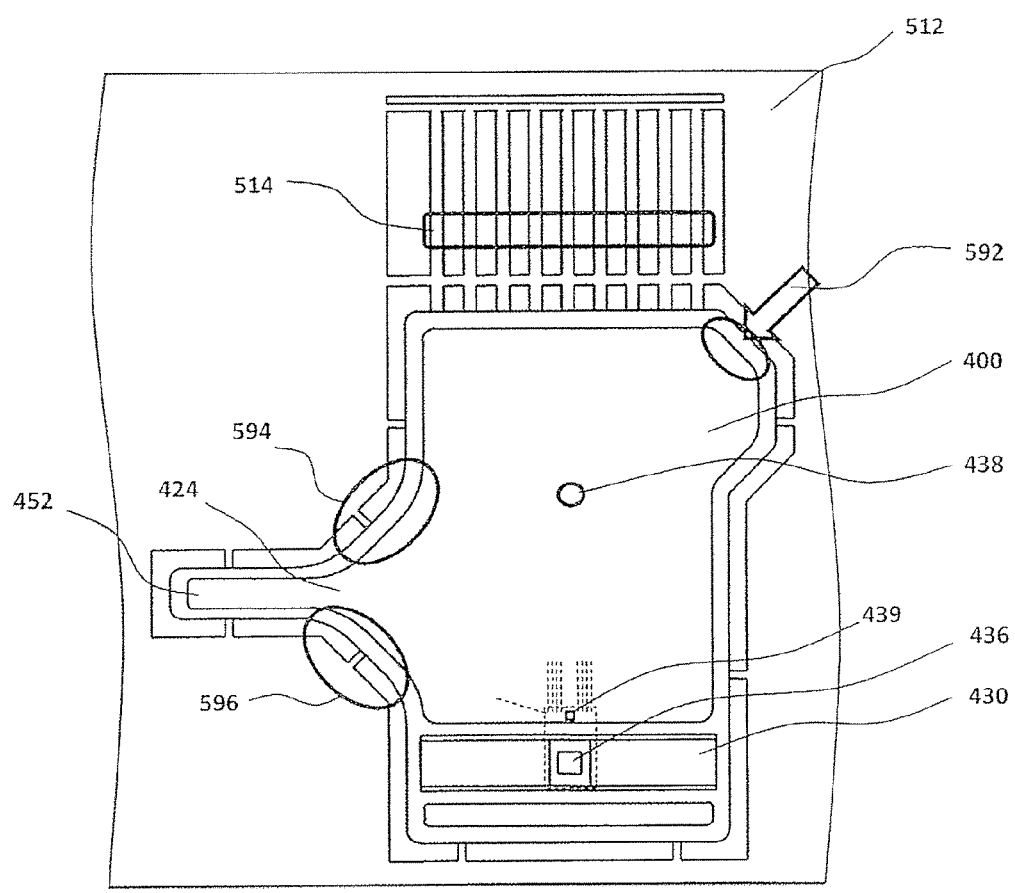

[Fig. 19]
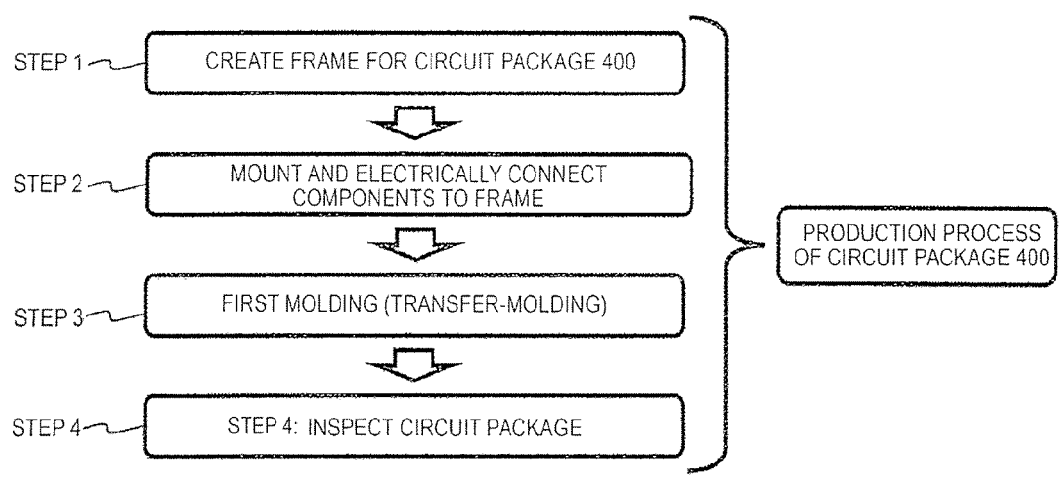

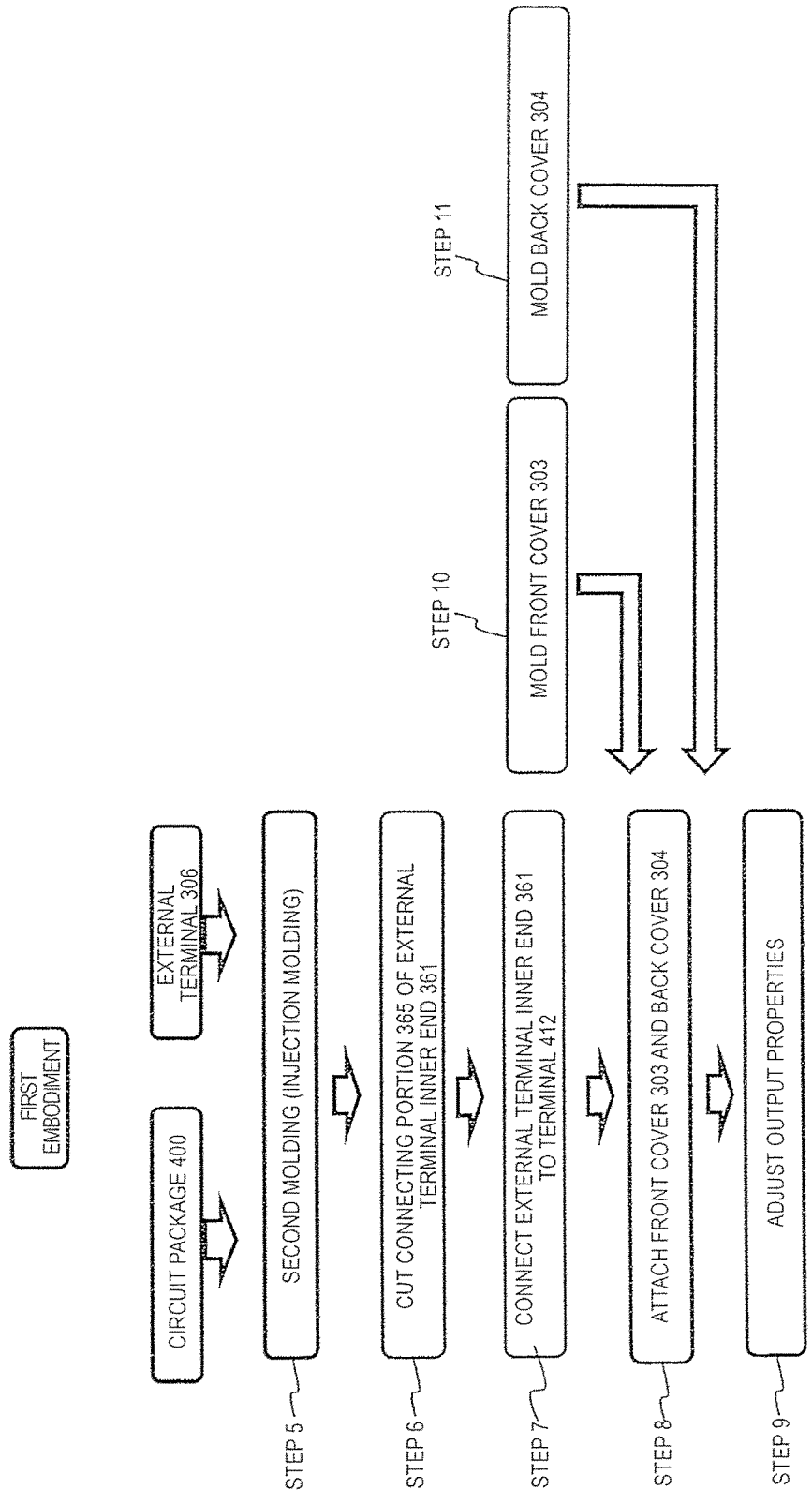
[Fig. 20]

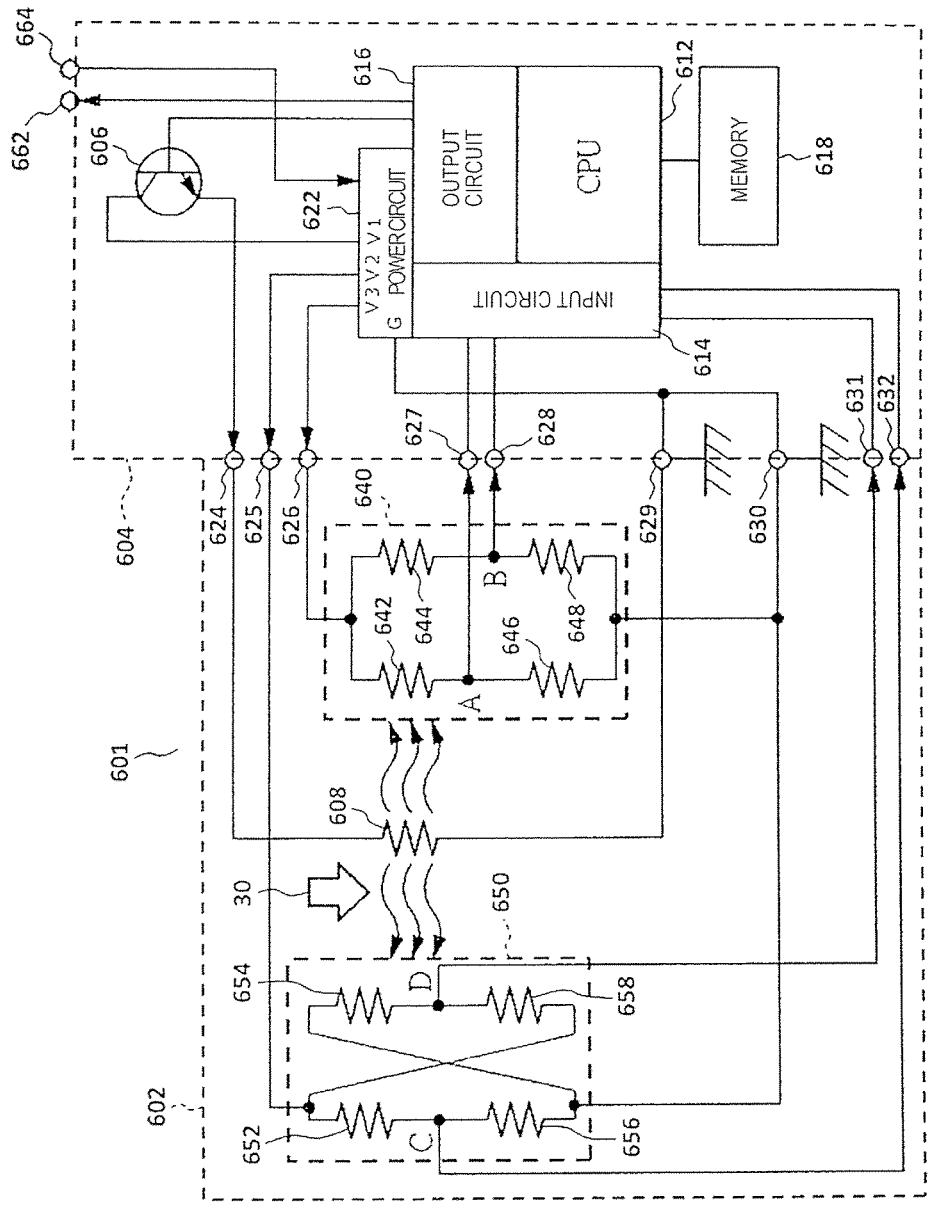
[Fig. 21]

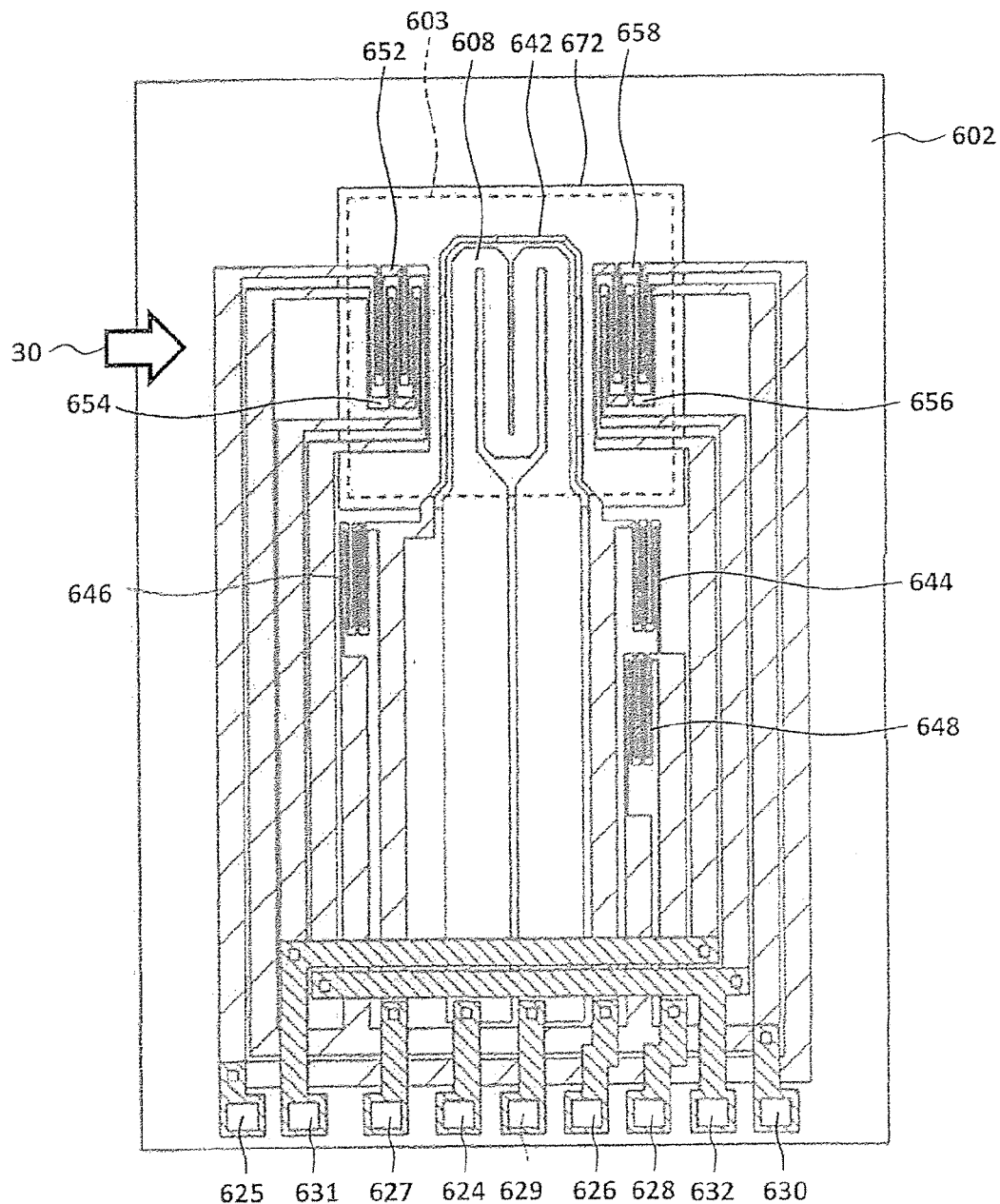
[Fig. 22]

THERMAL TYPE FLOWMETER

TECHNICAL FIELD

The present invention relates to a thermal type flowmeter.

BACKGROUND ART

A thermal type flowmeter for measuring a flow volume of gas is provided with a flow volume detection unit for measuring a flow volume and is configured to measure the flow volume of the gas by heat transfer between the flow volume detection unit and the gas as a target of the measurement. A flow volume that is measured by the thermal type flowmeter has been widely used as an important control parameter for various devices. As a feature of the thermal type flowmeter, it is possible to measure a flow volume, for example, a mass flow volume of gas with relatively higher precision as compared with flowmeters based on other schemes.

However, it has been desired to further improve precision in measuring the flow volume of gas. For example, a vehicle with an internal combustion engine mounted thereto exceedingly requires a reduction in fuel consumption and clean emissions. In order to respond to such requirements, it is necessary to measure the volume of intake air, as a main parameter of the internal combustion engine, with high precision. A thermal type flowmeter for measuring the volume of intake air introduced into the internal combustion engine is provided with an accessory path that takes a part of the intake air and a flow volume detection unit that is arranged in the accessory path, and the flow volume detection unit measures a state of measurement target gas flowing through the accessary path by performing heat transfer with the measurement target gas and outputs an electrical signal that indicates the volume of intake air introduced into the internal combustion engine. Such a technique is disclosed in JP-A-2011-252796 (PTL 1), for example.

PTL 1 discloses a technique of a thermal type flowmeter for measuring a volume of intake air that is introduced into an internal combustion engine. The thermal type flowmeter disclosed therein is provided with an accessory path that takes a part of intake air and a flow volume detection unit that is arranged in the accessory path and is configured to measure a state of measurement target gas flowing through the accessory path by performing heat transfer with the measurement target gas and output an electrical signal that indicates the volume of the intake air that is introduced into the internal combustion engine.

CITATION LIST

Patent Literature

PTL 1: JP-A-2011-252796
PTL 2: JP-A-2011-122984

SUMMARY OF INVENTION

Technical Problem

However, there is a concern that bending stress acts on a semiconductor chip and causes deformation of the semiconductor chip since a mold partially presses the surface of the semiconductor chip. Particularly, pressing force of the mold increases due to tolerance between the semiconductor chip and the other components in some cases, and there is a concern that excessive bending stress acts on the semiconductor chip and causes breakage thereof.

The present invention was made in view of the above circumstances, and an object thereof is to provide a method of manufacturing a thermal type flowmeter capable of reducing deformation of a semiconductor chip, which is caused by molding.

Solution to Problem

To solve the above problems, according to the invention, there is provided a method of manufacturing a thermal type flowmeter that includes a circuit package of a resin-molded semiconductor chip, the method including resin-molding a semiconductor chip in a state in which a mold is pressed a heat transfer surface that is provided on a surface of the semiconductor chip and a pressed surface that is set on the surface of the semiconductor chip at a position separate from the heat transfer surface.

Advantageous Effects of Invention

According to the present invention, it is possible to reduce deformation of a semiconductor chip, which is caused by molding. In addition, other problems, configurations, and effects will be clarified by the following description of embodiments.

BRIEF DESCRIPTION OF DRAWINGS

FIG. 1 is a system diagram illustrating an embodiment in which a thermal type flowmeter according to the present invention is applied to an internal combustion engine control system.

FIG. 2 is a diagram illustrating an appearance of the thermal type flowmeter, where FIG. 2(A) is a left side view and FIG. 2(B) is a front view.

FIG. 3 is a diagram illustrating the appearance of the thermal type flowmeter, where FIG. 3(A) is a right side view and FIG. 3(B) is a back view.

FIG. 4 is a diagram illustrating the appearance of the thermal type flowmeter, where FIG. 4(A) is a plan view and FIG. 4(B) is a bottom view.

FIG. 5 is a diagram illustrating a housing of the thermal type flowmeter, where FIG. 5(A) is a left side view of the housing and FIG. 5(B) is a front view of the housing.

FIG. 6 is a diagram illustrating the housing of the thermal type flowmeter, where FIG. 6(A) is a right side view of the housing and FIG. 6(B) is a back view of the housing.

FIG. 7 is a partially enlarged view illustrating a state of a flow path surface that is arranged in an accessory path.

FIG. 8 is a diagram illustrating an appearance of a front cover, where FIG. 8(A) is a left side view, FIG. 8(B) is a front view, and FIG. 8(C) is a plan view.

FIG. 9 is a diagram illustrating an appearance of a back cover 304, where FIG. 9(A) is a left side view, FIG. 9(B) is a front view, and FIG. 9(C) is a plan view.

FIG. 10 is a diagram of an appearance of a circuit package, where FIG. 10(A) is a left side view, FIG. 10(B) is a front view, and FIG. 10(C) is a back view.

FIG. 11 is a diagram illustrating a state in which circuit components are mounted on a frame of the circuit package.

FIG. 12 is an enlarged view of the flow volume detection unit illustrated in FIG. 11.

FIG. 13 is a cross-sectional view taken along line C-C in FIG. 10(B).

FIG. 14 is an explanatory diagram of an embodiment of a method of molding a circuit package.

FIG. 15-1 is an explanatory diagram of a comparative example of a method of molding a circuit package.

FIG. 15-2 is an explanatory diagram of a comparative example of a method of molding a circuit package.

FIG. 16 is an explanatory cross-sectional view of another embodiment.

FIG. 17 is an explanatory cross-sectional view of another embodiment.

FIG. 18 is a diagram illustrating a state of the circuit package after a first resin molding process.

FIG. 19 is a diagram illustrating a production process of a circuit package.

FIG. 20 is a diagram illustrating a production process of a thermal type flowmeter.

FIG. 21 is a circuit diagram illustrating a flow volume detection circuit of the thermal type flowmeter.

FIG. 22 is an explanatory diagram of the flow volume detection unit of the flow volume detection circuit.

DESCRIPTION OF EMBODIMENTS

Embodiments for implementing the present invention described below (hereinafter, referred to as embodiments) solve various problems, solutions to which have been required for an actual product, particularly solve various problems, solutions to which have been desired for usage as a measurement device for measuring a volume of intake air of a vehicle, and achieve various advantages. One of the various problems that are solved by the following embodiments is the problem described above in the section of Technical Problem, and one of the various advantages that are achieved by the following embodiment is the advantage described above in the section of Advantageous Effects of Invention. The various problems that are solved by the following embodiments and the various advantages that are achieved by the following embodiments will be described in the following description of the embodiments. Therefore, the problems and the advantages that are solved and achieved by the embodiments other than the content in the section of Technical Problem and the content in the section of Advantageous Effects of Invention will also be described in the following embodiments.

In the following embodiments, the same reference numerals represent the same configurations in different drawings, and the same effects are achieved. There is also a case in which only a reference numeral is given to a configuration that has already been described in a drawing and a description thereof is omitted.

1. Embodiment of Using Thermal Type Flowmeter According to the Present Invention in Internal Combustion Engine Control System FIG. 1 is a system diagram illustrating an embodiment in which a thermal type flowmeter according to the present invention is applied to an internal combustion engine control system based on an electronic fuel injection scheme. Based on an operation of an internal combustion engine 110 that is provided with an engine cylinder 112 and an engine piston 114, intake air is suctioned as measurement target gas 30 from an air cleaner 122 and is guided into a combustion chamber of the engine cylinder 112 via an air intake body, a throttle body 126, and an air intake manifold 128, for example, as a main path 124. The flow volume of the measurement target gas 30 which is the intake air that is guided into the combustion chamber is measured by a thermal type flowmeter 300 according to the present invention, and fuel is supplied from a fuel injection valve 152 based on the measured flow volume and is guided into the combustion chamber in a state of mixed gas along with the measurement target gas 30. According to the embodiment, the fuel injection valve 152 is provided at an air intake port of the internal combustion engine, and the fuel injected to the air intake port forms the mixed air with the measurement target gas 30, is guided into the combustion chamber via an intake valve 116, burns, and generates mechanical energy.

In recent years, a scheme of attaching the fuel injection valve 152 to a cylinder head of the internal combustion engine and directly injecting the fuel to each combustion chamber from the fuel injection valve 152 has been employed in many vehicles as an excellent scheme in terms of clean emissions and an improvement in fuel consumption. The thermal type flowmeter 300 can be applied not only to the scheme of injecting the fuel to the air intake port of the internal combustion engine as illustrated in FIG. 1 but also to the scheme of directly injecting the fuel to each combustion chamber in the same manner. Both the schemes are based on substantially the same basic concepts in relation to a control parameter measurement method, which includes a method of using the thermal type flowmeter 300, and an internal combustion engine control method, which includes the fuel supply amount and an ignition timing, and the scheme of injecting the fuel to the air intake port will be shown in FIG. 1 as a representative example of both the schemes.

The fuel and the air guided into the combustion chamber are in a state in which the fuel and the air are mixed with each other, explosively burn by spark ignition of an ignition plug 154, and generate mechanical energy. The gas after the combustion is guided into an exhaust tube from an exhaust valve 118 and is discharged as gas emission 24 from the exhaust tube to the outside of the vehicle. The flow volume of the measurement target gas 30 that is the intake air to be guided into the combustion chamber is controlled by a throttle valve 132, an opening level of which varies based on an operation of an accelerator pedal. The amount of fuel supply is controlled based on the flow volume of the intake air to be guided into the combustion chamber, and a driver can control the mechanical energy caused by the internal combustion engine by controlling the opening level of the throttle valve 132 to control the flow volume of the intake air to be guided into the combustion chamber.

1.1 Outline of Control by Internal Combustion Engine Control System

The flow volume and the temperature of the measurement target gas 30 taken from the air cleaner 122 and flowing through the main path 124 are measured by the thermal type flowmeter 300, and an electrical signal that indicates the flow volume and the temperature of the intake air is input from the thermal type flowmeter 300 to a control device 200. In addition, an output of a throttle angle sensor 144 for measuring an opening level of the throttle valve 132 is input to the control device 200, and furthermore, an output of a rotation angle sensor 146 is input to the control device 200 in order to measure positions and states of the engine piston 114, the intake valve 116, and the exhaust valve 118 of the internal combustion engine and a rotation speed of the internal combustion engine. In order to measure a state of a mixing ratio between the amount of the fuel and the amount of the air from the state of the gas emission 24, an output from an oxygen sensor 148 is input to the control device 200.

The control device 200 calculates the amount of fuel injection and the ignition timing based on the flow volume of the intake air as an output from the thermal type flowmeter 300 and the output from the rotation angle sensor 146. Based on results of the calculation, the amount of the fuel to be supplied from the fuel injection valve 152 and the ignition timing of the ignition by the ignition plug 154 are controlled. The amount of the fuel to be supplied and the ignition timing are further finely controlled based on variations in the temperature of the intake air and in the throttle angle that are measured by the thermal type flowmeter 300, variations in the engine rotation speed, and the state of the ratio between the air and the fuel that is measured by the oxygen sensor 148 in practice. The control device 200 further controls the volume of air for bypassing the throttle valve 132 by an idle air control valve 156 in a state in which the internal combustion engine is made to idle, and controls the rotation speed of the internal combustion engine in the idling state.

1.2 Importance of Improvement in Measurement Precision of Thermal Type Flowmeter and Installation Environment of Thermal Type Flowmeter Both the amount of the fuel to be supplied and the ignition timing as main control target values of the internal combustion engine are calculated by using an output from the thermal type flowmeter 300 as a main parameter. Therefore, it is important to improve measurement precision of the thermal type flowmeter 300, to suppress variations over time, and to improve reliability in order to improve control precision of a vehicle and to secure reliability thereof. There have been more requirements in relation to a reduction in fuel consumption of a vehicle and clean emissions in recent years, in particular. In order to respond to such requirements, it is significantly important to improve the measurement precision of the flow volume of the measurement target gas 30 to be measured by the thermal type flowmeter 300. In addition, it is also important for the thermal type flowmeter 300 to maintain high reliability.

The vehicle to which the thermal type flowmeter 300 is mounted is used in an environment in which there are large variations in temperature and may be used in windy, rainy, or snowy weather. In a case in which the vehicle travels along a snowy road, the vehicle travels on a road treated with an antifreezing agent. It is desirable that the thermal type flowmeter 300 is configured in consideration of responsiveness to variations in temperature in the environment of usage and responsiveness to dust, contaminating materials, and the like. Furthermore, the thermal type flowmeter 300 is installed in an environment in which vibrations of the internal combustion engine have an influence. It is also desirable to maintain high reliability with respect to the vibrations.

In addition, the thermal type flowmeter 300 is mounted in an air intake tube that is influenced by heat generation of the internal combustion engine. Therefore, the heat generation of the internal combustion engine is transferred to the thermal type flowmeter 300 via the air intake tube as the main path 124. It is important for the thermal type flowmeter 300 to suppress the influence of the external heat as much as possible since the thermal type flowmeter 300 measures the flow volume of the measurement target gas by performing heat transfer with the measurement target gas.

According to the thermal type flowmeter 300 that is mounted to a vehicle, not only the problem described in the section of Technical Problem but also various problems, solutions to which are required for the product, are solved as will be described below, and not only the advantage described in the section of Advantageous Effects of Invention but also various effects are achieved as will be described below, in sufficient consideration of the aforementioned various problems. Specific problems to be solved and specific advantages to be achieved by the thermal type flowmeter 300 will be described in the following description of the embodiments.

2. Configuration of Thermal Type Flowmeter 300

2.1 Appearance Structure of Thermal Type Flowmeter 300

FIGS. 2, 3, and 4 are diagrams illustrating an appearance of the thermal type flowmeter 300, where FIG. 2(A) is a left side view, FIG. 2(B) is a front view, FIG. 3(A) is a right side view, FIG. 3(B) is a back view, FIG. 4(A) is a plan view, and FIG. 4(B) is a bottom view of the thermal type flowmeter 300. The thermal type flowmeter 300 is provided with a housing 302, a front cover 303, and a back cover 304. The housing 302 is provided with a flange 312 for fixing the thermal type flowmeter 300 to the air intake body as the main path 124, an external connecting portion 305 including an external terminal 306 for electrical connection with an external device, and a measurement unit 310 for measuring a flow volume and the like. An accessory path groove for creating an accessory path is provided inside the measurement unit 310, and a circuit package 400 that includes a flow volume detection unit 602 (see FIG. 21) for measuring a flow volume of the measurement target gas 30 flowing through the main path 124 and a temperature detection unit 452 for measuring a temperature of the measurement target gas 30 flowing through the main path 124 is further provided inside the measurement unit 310.

2.2 Effects Based on Appearance Structure of Thermal Type Flowmeter 300

Since an inlet 350 of the thermal type flowmeter 300 is provided on a tip end side of the measurement unit 310 that extends in the direction from the flange 312 toward the center of the main path 124, it is possible to take gas at a portion near the center portion separate from an inner wall surface instead of air in the vicinity of the inner wall of the main path 124 into the accessory path. For this reason, the thermal type flowmeter 300 can measure the flow volume and the temperature of the gas at a portion separate from the inner wall surface of the main path 124, and can suppress degradation of measurement precision due to influences of heat and the like. The gas in the vicinity of the inner wall surface of the main path 124 is easily influenced by the temperature of the main path 124, and the temperature of the measurement target gas 30 differs from an original temperature of the gas, and differs from an average state of the main gas in the main path 124. In a case in which the main path 124 is an air intake body of an engine, in particular, the main path 124 is influenced by heat from the engine and is maintained at a high temperature in many cases. For this reason, the gas in the vicinity of the inner wall surface of the main path 124 is higher than the original temperature of the main path 124 in many cases, which may cause degradation of the measurement precision.

A fluid resistance is high in the vicinity of the inner wall surface of the main path 124, and the flow rate is lower than an average flow rate in the main path 124. For this reason, there is a concern that a decrease in the flow rate with respect to the average flow rate in the main path 124 results in a measurement error if the gas in the vicinity of the inner wall surface of the main path 124 is taken into the accessory path as the measurement target gas 30. Since the inlet 350 is provided at the tip end of the thin and long measurement unit 310 that extends from the flange 312 toward the center of the main path 124 in the thermal type flowmeter 300 illustrated in FIGS. 2 to 4, it is possible to reduce the measurement error related to the decrease in the flow rate in the vicinity of the inner wall surface. In addition, since the thermal type flowmeter 300 illustrated in FIGS. 2 to 4 has not only the configuration in which the inlet 350 is provided at the tip end of the measurement unit 310 that extends from the flange 312 toward the center of the main path 124 but also a configuration in which an outlet of the accessory path is provided at a tip end of the measurement unit 310, it is possible to further reduce the measurement error.

The measurement unit 310 of the thermal type flowmeter 300 has a long shape that extends in the direction from the flange 312 toward the center of the main path 124, and the inlet 350 for taking a part of the measurement target gas 30 such as intake air and the outlet 352 for returning the measurement target gas 30 from the accessory path to the main path 124 are provided at tip ends thereof. The measurement unit 310 has the long shape that extends along an axis from an outer wall of the main path 124 toward the center, and also has a narrow shape in the width direction as illustrated in FIGS. 2(A) and 3(A). That is, the measurement unit 310 of the thermal type flowmeter 300 has a substantially square shape in a front view and has a thin side surface. With such a shape, the thermal type flowmeter 300 can include an accessory path with a sufficient length and suppress the fluid resistance with respect to the measurement target gas 30 to a small value. For this reason, the thermal type flowmeter 300 can suppress the fluid resistance to a small value and measure the flow volume of the measurement target gas 30 with high precision.

2.3 Structure of Temperature Detection Unit 452

An inlet 343 that is located on a side of the flange 312 beyond the accessory path provided on the side of the tip end of the measurement unit 310 and opens toward the upstream side of the flow of the measurement target gas 30 as illustrated in FIGS. 2 and 3 is formed, and the temperature detection unit 452 for measuring the temperature of the measurement target gas 30 is arranged inside the inlet 343. An upstream-side outer wall in the measurement unit 310 that configures the housing 302 is depressed toward the downstream side at the center of the measurement unit 310 with the inlet 343 provided therein, and the temperature detection unit 452 has a shape of projecting from the upstream-side outer wall with the depressed shape toward the upstream side. In addition, the front cover 303 and the back cover 304 are provided on the opposite sides of the outer wall with the depressed shape, and upstream-side ends of the front cover 303 and the back cover 304 have a shape projecting from the outer wall with the depressed shape toward the upstream side. For this reason, the inlet 343 for taking the measurement target gas 30 is formed of the outer wall with the depressed shape, and the front cover 303 and the back cover 304 on the opposite sides thereof. The measurement target gas 30 taken into the inlet 343 is brought into contact with the temperature detection unit 452 provided inside the inlet 343, and the temperature detection unit 452 measures the temperature thereof. Furthermore, the measurement target gas 30 flows along a portion that supports the temperature detection unit 452 projecting from the outer wall of the housing 302 with the depressed shape toward the upstream side, and the gas from a front-side outlet 344 and a back-side outlet 345 provided in the front cover 303 and the back cover 304 are discharged to the main path 124.

2.4 Effects Related to Temperature Detection Unit 452

An effect of cooling the temperature at a portion supporting the temperature detection unit 452 to a temperature that is similar to the temperature of the measurement target gas 30 by measuring the temperature of the gas flowing into the inlet 343 from the upstream side of the direction of the flow of the measurement target gas 30 by the temperature detection unit 452 and causing the gas to flow toward a root portion of the temperature detection unit 452 that corresponds to the portion supporting the temperature detection unit 452. There is a concern that the temperature of the air intake tube as the main path 124 generally increases and the heat is transferred to the portion supporting the temperature detection unit 452 from the flange 312 or a heat insulating portion 315 through the upstream-side outer wall inside the measurement unit 310 and influences temperature measurement precision. The portion supporting the temperature detection unit 452 is cooled by causing the measurement target gas 30 to flow along the supporting portion after the temperature thereof is measured by the temperature detection unit 452 as described above. Therefore, it is possible to suppress the heat transfer from the flange 312 or the heat insulating portion 315 to the portion supporting the temperature detection unit 452 through the upstream-side outer wall inside the measurement unit 310.

Since the upstream-side outer wall inside the measurement unit 310 has a shape depressed toward the downstream side (which will be described later with reference to FIGS. 5 and 6) at the portion supporting the temperature detection unit 452, in particular, it is possible to set a distance between the upstream-side outer wall inside the measurement unit 310 and the temperature detection unit 452 to be long. As the heat transfer length increases, the distance of the cooling portion by the measurement target gas 30 increases. Therefore, it is possible to reduce the influence of the heat that is caused by the flange 312 or the heat insulating portion 315. Accordingly, the measurement precision is improved. Since the upstream-side outer wall has the shape depressed toward the downstream side (which will be described later with reference to FIGS. 5 and 6), fixation of the circuit package 400 (see FIGS. 5 and 6) which will be described later is facilitated.

2.5 Structures and Effects of Upstream-Side Side Surface and Downstream-Side Side Surface of Measurement Unit 310

An upstream-side protrusion 317 and a downstream protrusion 318 are provided on the upstream-side side surface and the downstream-side side surface, respectively, of the measurement unit 310 that configures the thermal type flowmeter 300. The upstream-side protrusion 317 and the downstream-side protrusion 318 have a shape that is tapered from the root toward the tip end, and can reduce the fluid resistance of the measurement target gas 30 as the intake air flowing inside the main path 124. The upstream-side protrusion 317 is provided between the heat insulating portion 315 and the inlet 343. A cross-sectional area of the upstream-side protrusion 317 is large, and heat transfer from the flange 312 or the heat insulating portion 315 is large. However, the upstream-side protrusion 317 ends before the inlet 343, and also, the upstream-side protrusion 317 has such a shape that the distance from the upstream-side protrusion 317 on the side of the temperature detection unit 452 to the temperature detection unit 452 is elongated by the depression in the upstream-side outer wall of the housing 302 as will be described later. Therefore, the heat transfer from the heat insulating portion 315 to the portion supporting the temperature detection unit 452 is suppressed.

In addition, a terminal connecting portion 320 which will be described later and an air gap including the terminal connecting portion 320 are created between the flange 312 or the heat insulating portion 315 and the temperature detection unit 452. Therefore, the distance between the flange 312 or the heat insulating portion 315 and the temperature detection unit 452 is elongated, the front cover 303 and the back cover 304 are provided at the elongated portion, and the portion works as a cooling surface. Accordingly, it is possible to reduce the influence of the temperature of the wall surface of the main path 124 on the temperature detection unit 452. In addition, it is possible to cause the portion, at which the measurement target gas 30 to be guided into the accessory path is taken, to approach the center of the main path 124 by elongating the distance between the flange 312 or the heat insulating portion 315 and the temperature detection unit 452. It is possible to suppress degradation of the measurement precision in relation to the wall surface of the main path 124.

As illustrated in FIGS. 2(B) and 3(B), the measurement unit 310 inserted into the main path 124 has significantly narrow opposite side surfaces, and also, the downstream-side protrusion 318 and the upstream-side protrusion 317 have a shape that is tapered from the root toward the tip end for reducing air resistance. Therefore, it is possible to suppress an increase in the fluid resistance that is caused by the insertion of the thermal type flowmeter 300 into the main path 124. In addition, the portions at which the downstream-side protrusion 318 and the upstream-side protrusion 317 are provided have such a shape that the upstream-side protrusion 317 and the downstream-side protrusion 318 project to the opposite sides from the opposite sides of the front cover 303 and the back cover 304. Since the upstream-side protrusion 317 and the downstream-side protrusion 318 are made by resin-molding, the upstream-side protrusion 317 and the downstream-side protrusion 318 can be easily molded into a shape with low air resistance. In contrast, the front cover 303 and the back cover 304 have a shape with a large cooling surface. Therefore, the thermal type flowmeter 300 exhibits effects of reducing the air resistance and being easily cooled by the measurement target air flowing through the main path 124.

2.6 Structure and Effects of Flange 312

A plurality of depressions 314 are provided in a lower surface of the flange 312 at portions facing the main path 124, reduce the surface of heat transfer with the main path 124, and cause the thermal type flowmeter 300 to be less influenced by the heat. A screw hole 313 of the flange 312 is for fixing the thermal type flowmeter 300 to the main path 124, and an air gap is formed between the surface around each screw hole 313, which faces the main path 124, and the main path 124 such that the surface around each screw hole 313, which faces the main path 124, is positioned so as to be separate from the main path 124. As described above, a structure capable of reducing the heat transfer from the main path 124 to the thermal type flowmeter 300 and preventing the measurement precision from being degraded due to the heat is provided. Furthermore, the depressions 314 exhibit not only the effect of reducing the heat transfer but also an effect of reducing an influence of contraction of resin, which configures the flange 312, during formation of the housing 302.

The heat insulating portion 315 is provided at the flange 312 on the side of the measurement unit 310. The measurement unit 310 of the thermal type flowmeter 300 is inserted into the inside from an attachment hole that is provided at the main path 124, and the heat insulating portion 315 faces an inner surface of the attachment hole of the main path 124. The main path 124 is an air intake body, for example, and the main path 124 is maintained at a high temperature in many cases. In contrast, it is considered that in a case of activation in a cold-weather region, the main path 124 is at a significantly low temperature. If such a high or low temperature of the main path 124 influences the temperature detection unit 452 and the flow volume measurement which will be described later, the measurement precision is degraded. Therefore, a plurality of depressions 316 are provided in the heat insulating portion 315 that is in contact with the hole inner surface of the attachment hole of the main path 124, the width of the heat insulating portion 315 that is in contact with the hole inner surface between adjacent depressions 316 is significantly thin and is equal to or less than one third of the width of the depression 316 in the direction of the flow of the fluid. In doing so, it is possible to reduce the influence of the temperature. In addition, resin at the heat insulating portion 315 is thick. Volume contraction is caused when the resin is cooled from a high-temperature state to a low temperature and is cured during the resin molding of the housing 302, and strain is caused due to occurrence of stress. By forming the depressions 316 in the heat insulating portion 315, it is possible to further uniformize the volume contraction and to reduce concentration of the stress.

The measurement unit 310 of the thermal type flowmeter 300 is inserted into the inside from the attachment hole provided in the main path 124 and is fixed to the main path 124 with a screw by the flange 312 of the thermal type flowmeter 300. It is desirable that the thermal type flowmeter 300 is fixed in a predetermined positional relationship with respect to the attachment hole provided in the main path 124. The depressions 314 provided in the flange 312 can be used for positioning the main path 124 and the thermal type flowmeter 300. By forming convexities in the main path 124, it becomes possible to form the convexities and the depressions 314 into shapes with a fitting relation and to fix the thermal type flowmeter 300 to the main path 124 at a precise position.

2.7 Structures and Effects of External Connecting Portion 305 and Flange 312

FIG. 4(A) is a plan view of the thermal type flowmeter 300. Four external terminals 306 and a correction terminal 307 are provided inside the external connecting portion 305. The external terminal 306 is a terminal for outputting the flow volume and the temperature as results of measurement by the thermal type flowmeter 300, and a power terminal for supplying DC power to operate the thermal type flowmeter 300. The correction terminal 307 is a terminal that is used to cause the produced thermal type flowmeter 300 to perform measurement, obtain a correction value related to each thermal type flowmeter 300, and store the correction value on a memory inside the thermal type flowmeter 300, and correction data that indicates the aforementioned correction value stored in the memory is used in the following measurement operation by the thermal type flowmeter 300 without using the correction terminal 307. Therefore, the correction terminal 307 has a shape that is different from that of the external terminal 306 such that the correction terminal 307 does not interfere with the connection between the external terminal 306 and another external device. According to the embodiment, the correction terminal 307 has a shape that is shorter than that of the external terminal 306 such that a connection failure does not occur even if the connection terminal to the external device to be connected to the external terminal 306 is inserted into the external connecting portion 305. In addition, a plurality of depressions 308 are provided inside the external connecting portion 305 along the external terminal 306, and the depressions 308 are for reducing stress concentration due to contraction of the resin that is caused when the resin as a material of the flange 312 is cooled and is hardened.

By providing the correction terminal 307 in addition to the external terminal 306 that is used for the measurement operation by the thermal type flowmeter 300, it is possible to measure a property of each thermal type flowmeter 300 before shipment thereof, to measure variations in products, and to store the correction value for reducing the variations in the memory inside the thermal type flowmeter 300. The correction terminal 307 is formed into a shape that is different from that of the external terminal 306 such that the correction terminal 307 does not interfere with the connection between the external terminal 306 and the external device after the process of setting the correction value. As described above, it is possible to reduce variations in the respective thermal type flowmeter 300 before shipment and to improve the measurement precision.

3. Overall Structure and Effects of Housing 302

3.1 Structures and Effects of Accessory Path and Flow Volume Detection Unit

A state of the housing 302 in which the front cover 303 and the back cover 304 are removed from the thermal type flowmeter 300 is shown in FIGS. 5 and 6. FIG. 5(A) is a left side view of the housing 302, FIG. 5(B) is a front view of the housing 302, FIG. 6(A) is a right side view of the housing 302, and FIG. 6(B) is a back view of the housing 302. The housing 302 has a structure in which the measurement unit 310 extends in a direction from the flange 312 toward the center of the main path 124, and an accessory path groove for forming the accessory path is provided on the side of the tip end thereof. According to the embodiment, the accessory path grooves are provided in both the front and back surfaces of the housing 302, FIG. 5(B) illustrates a front-side accessory path groove 332, and FIG. 6(B) illustrates a back-side accessory path groove 334. Since an inlet groove 351 for forming the inlet 350 of the accessory path and an outlet groove 353 for forming the outlet 352 are provided at tip ends of the housing 302, it is possible to take gas at a portion separate from the inner wall surface of the main path 124, in other words, gas flowing at a portion close to the center of the main path 124, as the measurement target gas 30 from the inlet 350. The gas flowing in the vicinity of the inner wall surface of the main path 124 is influenced by the temperature of the wall surface of the main path 124, and has a temperature that is different from an average temperature of the gas flowing through the main path 124, such as the measurement target gas 30 as intake air, in many cases. In addition, the gas flowing in the vicinity of the inner wall surface of the main path 124 has a lower flow rate than an average flow rate of the gas flowing through the main path 124 in many cases. Since the thermal type flowmeter 300 according to the embodiment is not easily influenced as described above, it is possible to suppress degradation of the measurement precision.

The accessory paths formed by the aforementioned front-side accessory path groove 332 and the back-side accessory path groove 334 continue to the heat insulating portion 315 via an outer wall depression 366, an upstream-side outer wall 335, and a downstream-side outer wall 336. In addition, the upstream-side protrusion 317 is provided in the upstream-side outer wall 335, and the downstream-side protrusion 318 is provided in the downstream-side outer wall 336. With such a structure, the thermal type flowmeter 300 is fixed to the main path 124 with the flange 312, and the measurement unit 310 with the circuit package 400 is fixed to the main path 124 with high reliability.

The embodiment is configured such that the accessory path grooves for forming the accessory paths are formed in the housing 302 and the accessory paths are completed by the accessory path grooves and the covers by covering the front surface and back surface of the housing 302 with the covers. With such a structure, it is possible to form all the accessory path grooves as parts of the housing 302 in the process of resin-molding the housing 302. In addition, since molds are provided on both surfaces of the housing 302 in forming the housing 302, it is possible to completely form both the front-side accessory path groove 332 and the back-side accessory path groove 334 as parts of the housing 302 by using both the molds. By providing the front cover 303 and the back cover 304 on both surfaces of the housing 302, it is possible to complete the accessory paths in both surfaces of the housing 302. By forming the front-side accessory path groove 332 and the back-side accessory path groove 334 in both the surfaces of the housing 302 by using the molds, it is possible to form the accessory paths with high precision. In addition, it is possible to achieve high productivity.

In FIG. 6(B), a part of the measurement target gas 30 flowing through the main path 124 is taken into the back-side accessory path groove 334 from the inlet groove 351 that forms the inlet 350, and flows inside the back-side accessory path groove 334. The back-side accessory path groove 334 has such a shape that becomes deeper as the back-side accessory path groove 334 extends, and the measurement target gas 30 gradually moves in the direction to the front side as the measurement target gas 30 flows along the groove. Particularly, the back-side accessory path groove 334 is provided with a steeply inclined portion 347 that is steeply inclined at an upstream portion 342 of the circuit package 400, and a part of air with a small volume moves along the steeply inclined portion 347 and flows through the upstream portion 342 of the circuit package 400 on the side of the measurement flow path surface 430 illustrated in FIG. 5(B). In contrast, since it is difficult for a foreign matter with a large volume to steeply change a course due to inertial force, the foreign matter moves on the side of a back-side exposed surface 403 illustrated in FIG. 6(B). Thereafter, the foreign matter passes through the downstream portion 341 of the circuit package 400 and flows on the side of the measurement flow path surface 430 illustrated in FIG. 5(B).

A description will be given of a flow of the measurement target gas 30 in the vicinity of a heat transfer surface exposed portion 436 with reference to FIG. 7. In the front-side accessory path groove 332 illustrated in FIG. 5(B), the air as the measurement target gas 30 that has moved from the aforementioned upstream portion 342 of the circuit package 400 to the side of the front-side accessory path groove 332 flows along the measurement flow path surface 430, and heat transfer is performed with the flow-volume detection unit 602 for measuring the flow volume via the heat transfer surface exposed portion 436 that is provided on the measurement flow path surface 430, and the flow volume is measured. The measurement target gas 30 that has passed through the measurement flow path surface 430 and the air that has flown from the downstream portion 341 of the circuit package 400 to the front-side accessory path groove 332 flow together along the front-side accessory path groove 332 and are discharged from the outlet groove 353 for forming the outlet 352 to the main path 124.

A substance with a large volume, such as a foreign particle mixed into the measurement target gas 30 has high inertial force, and it is difficult for the foreign particle to steeply change the course in a direction to the deep portion of the groove along the surface of the portion of the steeply inclined portion 347 at which the depth of the groove steeply increases as illustrated in FIG. 6(B). For this reason, the foreign matter with a large volume moves on the side of the back-side exposed surface 403, and it is possible to suppress passing of the foreign matter near the heat transfer surface exposed portion 436. Since the embodiment is configured such that many foreign matters with large volumes other than the gas pass on the side of the back-side exposed surface 403 that is a back surface of the measurement flow path surface 430, it is possible to reduce influences of contamination due to oil, carbon, foreign particles, and the like and to suppress degradation of the measurement precision. That is, since the shape of suddenly changing the course of the measurement target gas 30 along an axis across an axis of the flow of the main path 124 is employed, it is possible to reduce the influences of foreign matters that are mixed into the measurement target gas 30.

According to the embodiment, the flow path that is configured of the back-side accessory path groove 334 is curved and directed from the tip end of the housing 302 toward the flange, the gas flowing through the accessory path at the position that is closest to the flange side flows in the opposite direction to the direction of the flow of the main path 124, and the accessory path on the back surface side corresponding to one side continues to the accessory path formed on the front surface side corresponding to the other side at the portion of the flow in the opposite direction. In doing so, it becomes easier to fix the heat transfer surface exposed portion 436 of the circuit package 400 to the accessory paths and to take the measurement target gas 30 at a position close to the center of the main path 124.

The embodiment is configured such that the back-side accessory path groove 334 and the front-side accessory path groove 332 are penetrated before and after the measurement flow path surface 430, which is for measuring the flow volume, in the flow direction, and the circuit package 400 includes a hollow portion 383 on the tip end side instead of the configuration of being supported by the housing 302, and a space of the upstream portion 342 of the circuit package 400 continues to the space of the downstream portion 341 of the circuit package 400. As the configuration in which the upstream portion 342 of the circuit package 400 and the downstream portion 341 of the circuit package 400 are penetrated, the accessory paths are formed to have such a shape that the measurement target gas 30 moves from the back-side accessory path groove 334 formed on one surface of the housing 302 to the front-side accessory path groove 332 formed on the other surface of the housing 302. With such a configuration, it is possible to form the accessory path grooves on both the surfaces of the housing 302 in the process of the resin-molding performed one time and to simultaneously form the structure of connecting the accessory path grooves in both the surfaces.

When the housing 302 is formed, it is possible to form the configuration in which the upstream portion 342 of the circuit package 400 and the downstream portion 341 of the circuit package 400 are penetrated by clamping the opposite sides of the measurement flow path surface 430 that is formed on the circuit package 400 and to mount the circuit package 400 to the housing 302 at the same time with the resin-molding of the housing 302. By inserting the circuit package 400 into the mold for forming the housing 302 and molding the circuit package 400 as described above, it is possible to mount the circuit package 400 and the heat transfer surface exposed portion 436 relative to the accessory paths with high precision.

The embodiment is configured such that the upstream portion 342 of the circuit package 400 and the downstream portion 341 of the circuit package 400 are penetrated. However, it is also possible to form the shape of the accessory paths connecting the back-side accessory path groove 334 to the front-side accessory path groove 332 in the process of the resin-molding performed one time with a configuration in which one of the upstream portion 342 and the downstream portion 341 of the circuit package 400 is penetrated.

In addition, a back-side accessory path inner circumferential wall 391 and a back-side accessory path outer circumferential wall 392 are provided on the opposite sides of the back-side accessory path groove 334, and the back-side accessory path of the housing 302 is formed by bringing the tip ends of the back-side accessory path inner circumferential wall 391 and the back-side accessory path outer circumferential wall 392 in the height direction into close contact with the inner side surface of the back cover 304. In addition, a front-side accessory path inner circumferential wall 393 and a front-side accessory path outer circumferential wall 394 are provided on the opposite sides of the front-side accessory path groove 332, and the front-side accessory path of the housing 302 is formed by bringing the tip ends of the front-side accessory path inner circumferential wall 393 and the front-side accessory path outer circumferential wall 394 in the height direction into close contact with the inner side surface of the front cover 303.

An area-reduction shape is formed at the portion of the heat transfer surface exposed portion 436 that is provided on the measurement flow path surface 430 to measure the flow volume (a description will be given below with reference to FIG. 7), the flow rate increases the area-reducing effect, and the measurement precision is improved. Even if a vortex is caused in the flow of the gas on the upstream side of the heat transfer surface exposed portion 436, it is possible to eliminate or reduce the vortex by the area-reduction and to improve the measurement precision.

In FIGS. 5 and 6, the upstream-side outer wall 335 is provided with an outer wall depressed portion 366 that is formed into a shape depressed toward the downstream side at a root of the temperature detection unit 452. By the outer wall depressed portion 366, the distance between the temperature detection unit 452 and the outer wall depressed portion 366 is elongated, and it is possible to reduce the influence of the heat that is transferred via the upstream-side outer wall 335.

In addition, the circuit package 400 is fixed by wrapping the circuit package 400 with the fixing portion 372, and also, it is possible to increase the force of fixing the circuit package 400 by further fixing the circuit package 400 with the outer wall depressed portion 366. The fixing portion 372 wraps the circuit package 400 in the direction along the flow axis of the measurement target gas 30. In contrast, the outer wall depressed portion 366 wraps the circuit package 400 in the direction across the flow axis of the measurement target gas 30. That is, the circuit package 400 is wrapped in different wrapping directions with respect to the fixing portion 372. Since the circuit package 400 is wrapped in two different directions, the fixing force increases. Although the outer wall depressed portion 366 is a part of the upstream-side outer wall 335, the circuit package 400 may be wrapped with the downstream-side outer wall 336 instead of the upstream-side outer wall 335 in a direction that is different from the direction in which the fixing portion 372 wraps the circuit package 400 in order to enhance the fixing force. For example, a plate portion of the circuit package 400 may be wrapped with the downstream-side outer wall 336, or alternatively, a depression that is depressed in the upstream direction or a projection that project in the upstream direction may be provided in the downstream-side outer wall 336, and the circuit package 400 may be wrapped with the depression nor the projection. The reason that the outer wall depressed portion 366 is provided in the upstream-side outer wall 335 to wrap the circuit package 400 therewith is to provide an effect of increasing heat resistance between the temperature detection unit 452 and the upstream-side outer wall 335 in addition to the fixation of the circuit package 400.

The outer wall depressed portion 366 is provided at a root of the temperature detection unit 452, and with such a configuration, it is possible to reduce the influence of the heat that is transferred from the flange 312 or the heat insulating portion 315 via the upstream-side outer wall 335. Furthermore, a temperature measurement depression 368 that is formed of a notch between the upstream-side protrusion 317 and the temperature detection unit 452 is provided. By the temperature measurement depression 368, it is possible to reduce the heat transferred to the temperature detection unit 452 via the upstream-side protrusion 317. In doing so, the detection precision of the temperature detection unit 452 is improved. Since the upstream-side protrusion 317 has a large cross-sectional area, in particular, the heat is easily transferred, and the function of the temperature measurement depression 368 of inhibiting the heat transfer is important.

3.2 Structure and Effects of Flow Path Detection Unit in Accessory Path

FIG. 7 is a partially enlarged view illustrating a state in which the measurement flow path surface 430 of the circuit package 400 is arranged inside the accessory path groove, and corresponds to a cross-sectional view taken along A-A in FIG. 6. In addition, this drawing is a conceptual diagram, and detailed shapes illustrated in FIGS. 5 and 6 are omitted and simplified in FIG. 7, and details are slightly deformed. The left portion of FIG. 7 illustrates an ending terminal of the back-side accessory path groove 334, and the right portion thereof illustrates a beginning terminal of the front-side accessory path groove 332. Although not clearly illustrated in FIG. 7, a penetrating portion is provided on both the right and left sides of the circuit package 400 with the measurement flow path surface 430, and the back-side accessory path groove 334 continues to the front-side accessory path groove 332 on both the right and left sides of the circuit package 400 with the measurement flow path surface 430.

The measurement target gas 30 that has been taken from the inlet 350 and has flown through the back-side accessory path that is configured of the back-side accessory path groove 334 is guided from the left side in FIG. 7, a part of the measurement target gas 30 flows on the side of a flow path 386 that is created by the front surface of the measurement flow path surface 430 of the circuit package 400 and the protrusion 356 provided in the front cover 303 via the penetrating portion of the upstream portion 342 of the circuit package 400, and the rest of the measurement target gas 30 flows on the side of the flow path 387 that is created by the back-side exposed surface 403 and the back cover 304. Thereafter, the measurement target gas 30 that has flown through the flow path 387 moves to the side of the front-side accessory path groove 332 via the penetrating portion of the downstream portion 341 of the circuit package 400, joins the measurement target gas 30 flowing through the flow path 386, flows through the front-side accessory path groove 332, and is discharged from the outlet 352 to the main path 124.

Since the accessory path grooves are formed such that the measurement target gas 30 that is guided from the back-side accessory path groove 334 to the flow path 386 via the penetrating portion of the upstream portion 342 of the circuit package 400 is more greatly bent than the flow path that is guided to the flow path 387, substances with large volumes, such as foreign particles, that are contained in the measurement target gas 30 is collected on the side of the flow path 387 which is less bent. For this reason, substantially no foreign matter is flown into the flow path 386.

The flow path 386 has a structure with an area-reduction formed by providing the protrusion 356 in the front cover 303 so as to gradually project to the side of the measurement flow surface 430 continuously from the leading edge of the front-side accessory path groove 332. The measurement flow path surface 430 is arranged on one side of the area-reduced portion of the flow path 386, and the measurement flow path surface 430 is provided with the heat transfer surface exposed portion 436 at which the flow volume detection unit 602 performs heat transfer with the measurement target gas 30. In order to perform the measurement by the flow volume detection unit 602 with high precision, it is desirable that the measurement target gas 30 is a laminar flow including a small amount of vortex at the heat transfer surface exposed portion 436. In addition, the measurement precision is further improved as the flow rate increases. Therefore, the area-reduction is formed by the configuration of the protrusion 356 provided on the front cover 303 so as to face the measurement flow path surface 430, in which the protrusion 356 smoothly project toward the measurement flow path surface 430. The area-reduction works to reduce the vortex in the measurement gas 30 and cause the measurement target gas 30 to approach the laminar flow. Furthermore, since the flow rate increases at the area-reduced portion and the heat transfer surface exposed portion 436 for measuring the flow volume is arranged at the area-reduced portion, the flow volume measurement precision is improved.

By forming the area-reduction by causing the protrusion 356 to project toward the inside of the accessory path groove so as to face the heat transfer surface exposed portion 436 that is provided on the measurement flow path surface 430, it is possible to improve the measurement precision. The protrusion 356 for forming the air-reduction is provided on the cover that faces the heat transfer surface exposed portion 436 that is provided on the measurement flow path surface 430. Although the heat transfer surface exposed portion 436 is provided on the front cover 303 since the cover that faces the heat transfer surface exposed portion 436 provided on the measurement flow path surface 430 corresponds to the front cover 303 in FIG. 7, the heat transfer surface exposed portion 436 may be provided on the cover, which faces the heat transfer surface exposed portion 436 provided on the flow path surface 430, from among the front cover 303 and the back cover 304. Depending on which of the surfaces is provided with the measurement flow path surface 430 and the heat transfer surface exposed portion 436 in the circuit package 400, the cover to face the heat transfer surface exposed portion 436 differs.

In FIGS. 5 and 6, a pressing mark 442 of the mold that is used in the process of resin-molding the circuit package 400 remains in the back-side exposed surface 403 of the heat transfer surface exposed portion 436 that is provided on the measurement flow path surface 430. The pressing mark 442 does not cause a failure in measuring the flow volume, in particular, and no problem occurs if the pressing mark 442 remains. It is important to protect the semiconductor diaphragm included in the flow volume detection unit 602 when the circuit package 400 is resin-molded, as will be described later. Therefore, it is important to press the back surface (back-side exposed surface 403) of the heat transfer surface exposed portion 436. In addition, it is important that the resin covering the circuit package 400 does not flow into the heat transfer surface exposed portion 436. From such a viewpoint, the flowing of the resin thereinto is inhibited by surrounding the measurement flow path surface 430 including the heat transfer surface exposed portion 436 by a mold and pressing the back surface of the heat transfer surface exposed portion 436 with another mold. Since the circuit package 400 is created by transfer molding, the pressure of the resin is high, and it is important to press the heat transfer surface exposed portion 436 from the back surface thereof. In addition, since the semiconductor diaphragm is used in the flow volume detection unit 602, and it is desired to form an air gap ventilation path created by the semiconductor diaphragm. In order to hold and fix a plate for forming the ventilation path, it is important to press the heat transfer surface exposer portion 436 from the back surface thereof.

3.3 Shapes and Effects of Front Cover 303 and Back Cover 304

FIG. 8 is a diagram illustrating an appearance of the front cover 303, where FIG. 8(A) is a left side view, FIG. 8(B) is a front view, and FIG. 8(C) is a plan view. FIG. 9 is a diagram illustrating an appearance of the back cover 304, where FIG. 9(A) is a left side view, FIG. 9(B) is a front view, and FIG. 9(C) is a plan view. In FIGS. 8 and 9, the front cover 303 and the back cover 304 are used to create the accessory paths by blocking the accessory path grooves in the housing 302. In addition, the protrusion 356 is provided and is used to create the area-reduction. Therefore, it is desirable that molding precision is high. Since the front cover 303 and the back cover 304 are created by the resin-molding process in which thermoplastic resin is injected to the mold, it is possible to create the front cover 303 and the back cover 304 with high molding precision. In addition, a protrusion 380 and a protrusion 381 are formed on the front cover 303 and the back cover 304 to obtain a configuration in which the air gap of the hollow portion 383 on the tip end side of the circuit package 400, which is illustrated in FIGS. 5(B) and 6(B), is filled and the tip end of the circuit package 400 is covered when the housing 302 is fitted thereto.

A front protecting portion 322 and a back protecting portion 325 are provided on the front cover 303 and the back cover 304 illustrated in FIGS. 8 and 9. As illustrated in FIGS. 2 and 3, the front protecting portion 322 provided on the front cover 303 is arranged on the front-side side surface of the inlet 343, and the back protecting portion 325 provided on the back cover 304 is arranged on the back-side side surface of the inlet 343. The temperature detection unit 452 that is arranged inside the inlet 343 is protected by the front protecting portion 322 and the back protecting portion 325, and it is possible to prevent mechanical damage of the temperature detection unit 452 that is caused by the temperature detection unit 452 being hit by something during production or installation on a vehicle.

The protrusion 356 is provided on the inner surface of the front cover 303, and the protrusion 356 is arranged so as to face the measurement flow path surface 430 and has a long shape that extends in the direction along the axis of the flow path of the accessory path as illustrated in the example of FIG. 7. The cross-sectional shape of the protrusion 356 may be inclined toward the downstream side from an apex of the protrusion as illustrated in FIG. 8(C). The area-reduction is formed in the aforementioned flow path 386 by the measurement flow path surface 430 and the protrusion 356, and the effect of reducing the vortex caused in the measurement target gas 30 and causing a laminar flow is achieved. According to the embodiment, the accessory path including the area-reduced portion is divided into a groove portion and a cap portion that blocks the groove and completes the flow path provided with the area-reduction, and the accessory path is created by creating the groove portion in a second resin-molding process for forming the housing 302, then forming the front cover 303 including the protrusion 356 by another resin-molding process, and covering the groove with the front cover 303 as a cap of the groove. In the second resin-molding process for forming the housing 302, the circuit package 400 including the measurement flow path surface 430 is fixed to the housing 302. By forming the groove with a complicated shape in the resin-molding process and providing the protrusion 356 for the area-reduction in the front cover 303, it is possible to form the flow path 386 illustrated in FIG. 7 with high precision. In addition, It is possible to maintain an arrangement relationship of the groove, the measurement flow path surface 430, and the heat transfer surface exposed portion 436 with high precision and to thereby reduce variations in mass-produced products, and as a result, it is possible to achieve satisfactory measurement results. In addition, productivity is also improved.

The flow path 387 is formed by the back cover 304 and the back-side exposed surface 403 in the same manner. The flow path 386 is divided into a groove portion and a cap portion, and the flow path 387 is formed by creating the groove portion in the second resin-molding process for forming the housing 302 and covering the groove with the back cover 304. By creating the flow path 387 as described above, it is possible to create the flow path 386 with high precision and to improve productivity.

3.4 Molding of Housing 302 in Second Resin-Molding Process and Effects Thereof

In the aforementioned housing 302 illustrated in FIGS. 5 and 6, the circuit package 400 provided with the flow volume detection unit 602 and the processing unit 604 is manufactured in a first resin-molding process, and the housing 302 including the front-side accessory path groove 332 and the back-side accessory path groove 334, for example, for forming the accessory path through which the measurement target gas 30 is made to flow is then manufactured in the second resin-molding process. In the second resin-molding process, the circuit package 400 is built in the resin of the housing 302 and is fixed to the inside of the housing 302 by resin-molding. In doing so, it is possible to maintain a relationship with shapes of the heat transfer surface exposed portion 436, at which the flow volume detection unit 602 performs heat transfer with the measurement target gas 30 to measure the flow volume, and the accessory paths such as the front-side accessory path groove 332 and the back-side accessory path groove 334, for example, a positional relationship and a direction relationship with significantly high precision. It is possible to suppress errors and variations in circuit packages 400 to significantly small values. As a result, it is possible to greatly improve the measurement precision of each circuit package 400. The measurement precision is improved to a double or greater as compared with a conventional fixation scheme using an adhesive, for example. The thermal type flowmeter 300 is mass-produced in many cases, and from this viewpoint, the method of establishing adhesion with an adhesive while strictly performing measurement has limitations in terms of an improvement in the measurement precision. However, it is possible to greatly reduce the variations in the measurement precision and to greatly improve the measurement precision of each thermal type flowmeter 300 by creating the circuit package 400 in the first resin-molding process and then fixing circuit package 400 to the accessory paths at the same time with the forming of the accessory paths in the second resin-molding process for forming the accessory paths through which the measurement target gas 30 is made to flow. This is similarly applied not only to the embodiment illustrated in FIGS. 5 and 6 but also the embodiment illustrated in FIG. 7.

A further description will be given of the embodiments illustrated in FIGS. 5 and 6, in which the circuit package 400 can be fixed to the housing 302 with high precision such that the relationships of the front-side accessory path groove 332, the back-side accessory path groove 334, and the heat transfer surface exposed portion 436 are predefined relationships. In doing so, it becomes possible to constantly obtain the positional relationships, the shape relationships, and the like of the heat transfer surface exposed portion 436 of each circuit package 400 and the accessory paths in each of mass-produced thermal type flowmeters 300 with significantly high precision. Since it is possible to form the accessory path grooves to which the heat transfer surface exposed portion 436 of the circuit package 400 is fixed, for example, the front-side accessory path groove 332 and the back-side accessory path groove 334 with high precision, the operation of forming the accessory paths from the accessory path grooves is an operation of covering both the surfaces of the housing 302 with the front cover 303 and the back cover 304. The operation includes an operation process that is significantly simple and includes a small number of factors that may cause degradation of the measurement precision. The front cover 303 and the back cover 304 are produced in the resin-molding process with high formation precision. Therefore, it is possible to complete the accessory paths, which are provided in a predefined relationship with the heat transfer surface exposed portion 436 of the circuit package 400, with high precision. By such a method, it is possible to achieve an improvement in the measurement precision and high productivity.

In contrast, a thermal type flowmeter is conventionally produced by manufacturing the accessory paths and the causing the measurement unit to adhere to the accessory paths with an adhesive. According to the method using the adhesive as described above, the thicknesses of the adhesive greatly vary, and adhesion positions and adhesion angles vary in the respective products. Therefore, an improvement in the measurement precision is limited. Furthermore, it is significantly difficult to improve the measurement precision when such operations are performed in mass-production processes.

According to the embodiment of the present invention, the circuit package 400 provided with the flow volume detection unit 602 is produced first in the first resin-molding, and the accessory path grooves for forming the accessory paths by the resin-molding are then formed in the second resin-molding at the same time with the fixation of the circuit package 400 by the resin-molding. In doing so, it is possible to exhibit high precision in the shapes of the accessory path grooves and to fix the flow volume detection unit 602 to the accessory path grooves with high precision.

Portions related to the measurement of the flow volume, for example, the heat transfer surface exposed portion 436 of the flow volume detection unit 602 and the measurement flow path surface 430 to which the heat transfer surface exposed portion 436 are attached are formed on the surface of the circuit package 400. Thereafter, the measurement flow path surface 430 and the heat transfer surface exposed portion 436 are exposed from the resin for forming the housing 302. That is, the heat transfer surface exposed portion 436 and the measurement flow path surface 430 around the heat transfer surface exposed portion 436 are not covered with the resin for forming the housing 302. The measurement flow path surface 430 and the heat transfer surface exposed portion 436 that are formed by the resin-molding of the circuit package 400, or the temperature detection unit 452 is used as it is after the resin-molding of the housing 302 and is used for measuring the flow volume and the temperature of the thermal type flowmeter 300. In doing so, the measurement precision is improved.

Since the circuit package 400 is fixed to the housing 302 including the accessory paths by integrally forming the circuit package 400 with the housing 302 in the embodiment of the present invention, it is possible to fix the circuit package 400 to the housing 302 at a small fixed area. That is, it is possible to increase the surface area of the circuit package 400, at which the circuit package 400 is not in contact with the housing 302. The surface of the circuit package 400, which is not in contact with the housing 302, is exposed to an air gap, for example. The heat of the air intake tube is transferred to the housing 302 and is then transferred from the housing 302 to the circuit package 400. It is possible to fix the circuit package 400 to the housing 302 while maintaining high precision and high reliability by reducing the contact area between the housing 302 and the circuit package 400 instead of wrapping the entire surface or a major part of the surface of the circuit package 400 with the housing 302. Therefore, it is possible to suppress the heat transfer from the housing 302 to the circuit package 400 to be low and to suppress degradation of the measurement precision.

According to the embodiment illustrated in FIGS. 5 and 6, it is possible to set an area A of the exposed surface of the circuit package 400 to be equal to or greater than an area B at which the circuit package 400 is covered with the molding material for forming the housing 302. In the embodiment, the area A is greater than the area B. In doing so, it is possible to suppress the heat transfer from the housing 302 to the circuit package 400. In addition, it is possible to reduce stress that is caused by a difference between a thermal expansion coefficient of the thermosetting resin that forms the circuit package 400 and an expansion coefficient of the thermoplastic resin that forms the housing 302.

4. Appearance of Circuit Package 400

4.1 Forming of Measurement Flow Path Surface 430 Provided with Heat Transfer Surface Exposed Portion 436

FIG. 10 illustrates an appearance of the circuit package 400 that is created in the first resin-molding process. In addition, the hatched portion illustrated in the appearance of the circuit package 400 corresponds to the fixed surface 432 at which the circuit package 400 is covered with the resin that is used in the second resin-molding process when the housing 302 is formed in the second resin-molding process after the circuit package 400 is manufactured in the first resin-molding process. FIG. 10(A) is a left side view of the circuit package 400, FIG. 10(B) is a front view of the circuit package 400, and FIG. 10(C) is a back view of the circuit package 400. The flow volume detection unit 602 and the processing unit 604, which will be described later, are built in the circuit package 400, are molded with thermoplastic resin, and are integrally formed.

The circuit package 400 has a vertically long plate-like shape that orthogonally intersects with the flow direction of the measurement target gas 30 as illustrated in FIGS. 10(B) and 10(C), the tip end 401 is made to project toward the inside of the accessory path by mold-fixing the fixed surface 432 to the housing 302, and the front-side exposed surface 402 and the back-side exposed surface 403 of the tip end 401 are arranged in parallel with each other along the flow direction of the measurement target gas 30.

The measurement flow path surface 430 that works as a surface for causing the measurement target gas 30 to flow is formed into a long shape that extends in the flow direction of the measurement target gas 30 in the front-side exposed surface 402 of the tip end 401 in a surface 400a of the circuit package 400 illustrated in FIG. 10(B). According to the embodiment, the measurement flow path surface 430 has a long square shape that extends in the flow direction of the measurement target gas 30. The measurement flow path surface 430 is made to have a thinner thickness as compared with the other portions as illustrated in FIG. 10(A), and the heat transfer surface exposed portion 436 is provided on a part of the measurement flow path surface 430.

The built-in flow volume detection unit 602 (see FIG. 21) performs heat transfer with the measurement target gas 30 via the heat transfer surface exposed portion 436, measure a state of the measurement target gas 30, for example, a flow rate of the measurement target gas 30, and outputs an electrical signal that indicates the flow rate of the measurement target gas 30 flowing through the main path 124.

In order for the built-in flow volume detection unit 602 to measure the state of the measurement target gas 30 with high precision, it is desirable that the gas flowing in the vicinity of the heat transfer surface exposed portion 436 forms laminar flow and includes a small amount of disturbance. For this reason, it is preferable that a level difference between the flow path side surface at the heat transfer surface exposed portion 436 and the measurement flow path surface 430 for guiding the gas is small. With such a configuration, it is possible to suppress non-uniform stress and strain working on the flow volume detection unit 602 while maintaining the flow volume measurement precision with high precision. In addition, it is possible to provide a level difference as long as the level difference does not influence the flow measurement precision.

The pressing mark 442 after the pressing with the mold supporting the inner substrate or the plate when the circuit package 400 is resin-molded remains in the back-side exposed surface 403 of the measurement flow path surface 430 including the heat transfer surface exposed portion 436 as illustrated in FIG. 10(C). The heat transfer surface exposed portion 436 is a position that is used for exchanging heat with the measurement target gas 30, and it is desirable that the heat transfer is satisfactory performed between the flow volume detection unit 602 and the measurement target gas 30 in order to precisely measure the state of the measurement target gas 30. Therefore, it is necessary to avoid the heat transfer surface exposed portion 436 being covered with the resin in the first resin-molding process. The mold is brought into contact with both the heat transfer surface exposed portion 436 and the back-side exposed surface 403 as a back surface thereof, and the flowing of the resin into the heat transfer surface exposed portion 436 is prevented by the mold.

A pressing mark 439 with a concave shape is formed by the mold that supports the flow volume detection unit (flow volume detection element) 602 when the circuit package 400 is resin-molded, at a position in the vicinity of the heat transfer surface exposed portion 436 on the front-side exposed surface 402 as illustrated in FIG. 10(B), and a pressed surface 602a of the flow volume detection unit 602 is exposed. There is a concern that the flow volume detection unit 602 that is a semiconductor chip is deformed due to bending stress working thereon if the heat transfer surface 437 which is formed into the heat transfer surface exposed portion 436 by a mold 703 is pressed when the circuit package 400 is resin-molded. Thus, the mold 703 also presses the pressed surface 602a that is set on the surface of the flow volume detection unit 602 at a position separate from the heat transfer surface 437 in addition to the heat transfer surface 437, and the bending stress is prevented from working on the flow volume detection unit 602.

A pressing mark 442 with a concave shape is formed in the back-side exposed surface 403 of the heat transfer surface exposed portion 436. Elements configuring the flow volume detection unit 602 and the like are arranged near the portion, and it is desirable that heat generation of the elements is released to the outside as much as possible. The formed concavity is less influenced by the resin and exhibits an effect that the concavity easily releases heat.

A semiconductor diaphragm corresponding to the heat transfer surface exposed portion 436 is formed in the flow volume detection unit (flow volume detection element) 602 that is configured of a semiconductor element, and the semiconductor diaphragm can be obtained by forming an air gap on the back surface side of the flow volume detection unit 602. If the air gap is tightly closed, the semiconductor diaphragm is deformed due to variations in the pressure inside the air gap, which are caused by variations in the temperature, and the measurement precision is degraded. For this reason, an opening 438 that communicates with the air gap on the back surface side of the semiconductor diaphragm is provided in the surface of the circuit package 400, and a communication path that connects the air gap on the back surface side of the semiconductor diaphragm and the opening 438 is provided inside the circuit package 400. In addition, the opening 438 is provided in a portion that is not hatched in FIG. 10, that is, the portion other than the fixed surface 432 so as not to be filled with the resin in the second resin-molding process.

It is necessary to form the opening 438 in the first resin-molding process, and the opening 438 is formed while the flowing of the resin into the opening 438 is inhibited by bringing the mold into contact with the opening 438 and the back surface and pressing both the front and back surfaces with the mold. Formation of the opening 438 and the communication path connecting between the air gap on the back surface side of the semiconductor diaphragm and opening 438 will be described later.

4.2 Formation and Effects of Temperature Detection Unit 452 and Projection 424

The temperature detection unit 452 that is provided in the circuit package 400 is also provided with a tip end of the projection 424 that extends in the upstream direction of the measurement target gas 30 in order to support the temperature detection unit 452, and has a function of detecting the temperature of the measurement target gas 30. In order to detect the temperature of the measurement target gas 30 with high precision, it is desirable to minimize heat transfer with portions other than the measurement target gas 30. The projection 424 that supports the temperature detection unit 452 has a shape that is tapered from the root thereof toward the tip end, and the temperature detection unit 452 is provided at the tip end thereof. With such a shape, an influence of heat from the root of the projection 424 on the temperature detection unit 452 is reduced.

The measurement target gas 30 flows along the projection 424 after the temperature detection unit 452 detects the temperature of the measurement target gas 30, and works to cause the temperature of the projection 424 to approach the temperature of the measurement target gas 30. In doing so, the influence of the temperature at the root of the projection 424 on the temperature detection unit 452 is suppressed. According to the embodiment, in particular, the projection 424 is thin in the vicinity of the temperature detection unit 452 and gradually becomes thicker toward the root of the projection 424. Therefore, the measurement target gas 30 flows along such a shape of the projection 424 and effectively cools the projection 424.

The hatched portion at the root of the projection 424 corresponds to the fixed surface 432 that is covered with the resin for forming the housing 302 in the second resin-molding process. A depression is provided in the hatched portion at the root of the projection 424. This indicates that a portion with a depressed shape that is not covered with the resin of the housing 302 is provided. By providing such a portion with the depressed shape that is not covered with the resin of the housing 302 at the root of the projection 424 as described above, the projection 424 can be further easily cooled with the measurement target gas 30.

4.3 Terminal of Circuit Package 400

The circuit package 400 is provided with a connection terminal 412 in order to supply power to operate the built-in flow volume detection unit 602 and the processing unit 604 and output a flow volume measurement value and a temperature measurement value. Furthermore, a terminal 414 is provided in order to inspect whether or not the circuit package 400 appropriately operates and whether or not abnormality has occurred in circuit components and in connections thereof. According to the embodiment, the circuit package 400 is produced by transfer-molding the flow volume detection unit 602 and the processing unit 604 by using thermosetting resin in the first resin-molding process. By performing the transfer-molding, it is possible to improve dimensional precision of the circuit package 400. However, since pressurized high-temperature resin is press-fitted into the tightly closed mold that includes the built-in flow volume detection unit 602 and the processing unit 604 in the transfer-molding process, it is desirable to inspect whether or not the flow volume detection unit 602, the processing unit 604, and wiring relationships thereof have not been damaged in the completed circuit package 400. According to the embodiment, a terminal 414 for the inspection is provided, and each produced circuit package 400 is inspected. Since the inspection terminal 414 is not used for the measurement, the terminal 414 is not connected to the external terminal inner end 361 as described above. In addition, each connection terminal 412 is provided with a curved portion 416 in order to increase mechanical elastic force. By providing the mechanical elastic force to each connection terminal 412, it is possible to absorb the stress that is caused by a difference between the thermal expansion coefficients of the resin used in the first resin-molding process and the resin used in the second resin-molding process. That is, each connection terminal 412 is influenced by the thermal expansion in the first resin-molding process, and also, the external terminal inner end 361 connected to each connection terminal 412 is influenced by the resin used in the second resin-molding process. It is possible to absorb the occurrence of the stress that is caused by the difference in the resin.

4.4 Fixation of Circuit Package 400 in Second Resin-Molding Process and Effects Thereof The hatched portion in FIG. 10 represents the fixed surface 432 for covering the circuit package 400 with the thermoplastic resin that is used in the second resin-molding process in order to fix the circuit package 400 to the housing 302 in the second resin-molding process. As described above with reference to FIGS. 5 and 6, it is important to maintain the relationship of the shapes of the measurement flow path surface 430, the heat transfer surface exposed portion 436 that is provided in the measurement flow path surface 430, and the accessory paths in the predefined relationship with high precision. Since the circuit package 400 is fixed to the housing 302 in which the accessory paths are formed at the same time with the formation of the accessory paths in the second resin-molding process, it is possible to maintain the relationship of the accessory paths, the measurement flow path surface 430, and the heat transfer surface exposed portion 436 with significantly high precision. That is, since the circuit package 400 is fixed to the housing 302 in the second resin-molding process, it is possible to position the circuit package 400 inside the mold for forming the housing 302 provided with the accessory paths and to fix the circuit package 400 thereto with high precision. By injecting the high-temperature thermoplastic resin into the mold, the accessory paths are formed with high precision, and the circuit package 400 is fixed with high precision.

According to the embodiment, the surface of the circuit package 400 exposed on the side of the connection terminal 412, that is, the portion that is not covered with the resin for forming the housing 302 is provided instead of providing the fixing surface 432, which is covered with the resin for forming the housing 302, on the entire surface of the circuit package 400. According to the embodiment illustrated in FIG. 10, the area that is not wrapped with the resin for forming the housing 302 and is exposed form the resin for forming the housing 302 is greater than the area of the fixed surface 432 that is wrapped with the resin for forming the housing 302 in the surface of the circuit package 400.

There is a difference between thermal expansion coefficients of the thermosetting resin for forming the circuit package 400 and the thermoplastic resin for forming the housing 302 that is provided with the fixing portion 372, and it is desirable to minimize the stress based on the difference between the thermal expansion coefficients which is applied to the circuit package 400. By reducing the fixed surface 432 on the surface of the circuit package 400, it is possible to reduce the influence based on the difference between the thermal expansion coefficients. It is possible to reduce the fixed surface 432 on the surface of the circuit package 400 by employing a strip shape with a width L, for example.

In addition, it is possible to enhance the mechanical strength of the projection 424 by providing the fixed surface 432 at the root of the projection 424. It is possible to further firmly fix the circuit package 400 and the housing 302 by providing the strip-shaped fixed surface in the direction along the axis of the flow of the measurement target gas 30 and providing the fixed surface in the direction intersecting the axis of the flow of the measurement target gas 30 on the surface of the circuit package 400. On the fixed surface 432, a portion that surrounds the circuit package 400 in the strip shape with the width L along the measurement flow path surface 430 corresponds to the aforementioned fixed surface in the direction along the axis of the flow of the measurement target gas 30, and the portion covering the root of the projection 424 corresponds to the fixed surface in the direction across the axis of the flow of the measurement target gas 30.

5. Installation of Circuit Components on Circuit Package

5.1 Frame of Circuit Package

FIG. 11 illustrates a frame 512 of the circuit package 400 and an installation state of a chip as a circuit component 516 that is mounted to the frame 512. FIG. 12 is an enlarged view of the flow volume detection unit 602 in FIG. 11. The hatched portion 508 represents the portion that is covered with the mold used in the molding of the circuit package 400.

A lead 514 is mechanically connected to the frame 512, a plate (substrate) 532 is mounted at the center of the frame 512, and the flow volume detection unit (flow volume detection element) 602 and the processing unit 604 that is created as an LSI are mounted to the plate 532. The back surface of the flow volume detection unit 602 is fixed to the plate 532 with an adhesive 531 interposed between the flow volume detection unit 602 and the plate 532. A diaphragm 672 is formed in a flow volume detection region of the flow volume detection unit 602, and each terminal 623 of the flow volume detection unit 602, which will be described later, and the processing unit 604 are electrically connected with a wire 542. Furthermore, each terminal of the processing unit 604 and the corresponding lead 514 are connected with the wire 543. In relation to the lead 514 that is located between the portion corresponding to the connection terminal of the circuit package 400 and the plate 532, the chip-shaped circuit component 516 is connected therebetween.

The flow volume detection unit 602 has a square shape that extends along the plate 532, and the diaphragm 672 is arranged at a portion on the tip end side of the circuit package 400, which corresponds to one side of a long-side direction beyond the center of the flow volume detection unit 602. In addition, a plurality of terminals 623 to which the wire 542 is connected are provided at portions on the base end side (connection terminal side) of the circuit package 400, which corresponds to the other side of the long-side direction beyond the center of the flow volume detection unit 602. The plurality of terminals are provided on the surface of the flow volume detection unit 602 along a short-side portion 602b that is an end side located at the furthest position from the diaphragm 672 as illustrated in FIG. 12. The plurality of terminals 623 are divided into two sets along the short-side portion 602b of the flow volume detection unit 602, and the pressed surface 602a pressed with the mold 703 is set at a position between the two terminal groups.

The flow volume detection unit 602 including the diaphragm 672 is arranged on the side that is closest to the tip end in the case of the circuit package 400 is completed as described above, the processing unit 604 is arranged in a state of an LSI on the side of the connection terminal with respect to the flow detection unit 602, and the connection wire 543 is further arranged on the side of terminal of the processing unit 604. By arranging the flow volume detection unit 602, the processing unit 604, the wire 543, the circuit component 516, and the connection lead 514 in this order from the tip end side of the circuit package 400 toward the connection terminal as described above, the entire configuration is simplified, and simple arrangement is achieved as a whole.

A thick lead is provided in order to support the plate 532, and the lead is fixed to the frame 512 with a lead 556 and a lead 558. In addition, a lead surface, which is not shown in the drawing, with the same area as that of the plate 532 to be connected with the thick lead is provided on the lower surface of the plate 532, and the plate 532 is mounted on the lead surface. The lead surface is grounded. In doing so, it is possible to suppress noise by commonly establishing the grounding in the circuits of the aforementioned flow volume detection unit 602 and the processing unit 604 via the lead surface and to improve the measurement precision of the measurement target gas 30. In addition, a lead 544 is provided so as to project toward the upstream side of the flow path from the plate 532, that is, along the axis in the direction across the axes of the aforementioned flow volume detection unit 602, the processing unit 604, and the circuit component 516. A temperature detection element 518 such as a chip-shaped thermistor is connected to the lead 544. Furthermore, a lead 548 is provided near the processing unit 604 at the root of the projection, and the lead 544 and the lead 548 are electrically connected to each other with a thin connection line 546. If the lead 548 and the lead 544 are directly connected to each other, heat is transferred to the temperature detection element 518 via the lead 548 and the lead 544, and it becomes impossible to precisely measure the temperature of the measurement target gas 30. Therefore, it is possible to increase a heat resistance between the lead 548 and the lead 544 by establishing the connection with a line with high heat resistance that is a line with a small cross-sectional area. In doing so, the measurement precision of the temperature of the measurement target gas 30 is improved without causing the heat not to influence the temperature detection element 518.

In addition, the lead 548 is fixed to the frame 512 with a lead 552 and a lead 554. The connecting portions of the lead 552, the lead 554, and the frame 512 are fixed to the frame 512 in a state of being inclined with respect to the projecting direction of the projecting temperature detection element 518, and the mold is obliquely arranged at this portion. By causing the molding resin to flow along the oblique state in the first resin-molding process, the molding resin used in the first resin-molding process smoothly flows to the tip end at which the temperature detection element 518 is provided, and reliability is improved.

In FIG. 11, an arrow 592 that indicates the resin press-fitting direction is illustrated. A lead frame to which the circuit components are mounted is covered with a mold, a press-fitting port 590 for injecting resin is provided at a position marked with the circle in the mold, and thermosetting resin is injected from the direction of the arrow 592 into the mold. The circuit component 516 and the temperature detection element 518 are present in the direction of the arrow 592 from the press-fitting port 590, and the lead 544 for holding the temperature detection element 518 is present. Furthermore, the plate 532, the processing unit 604, and the flow volume detection unit 602 are provided in a direction near the direction of the arrow 592. With such arrangement, the resin smoothly flows in the first resin-molding process. The thermosetting resin is used in the first resin-molding process, and it is important to cause the resin to reach the entire target area before curing. For this reason, a relation of arrangement of the circuit components and the wiring at the lead 514 and the press-fitting port 590 and the press-fitting direction play significantly important roles.

5.2 Structure Connecting Air Gap on Back Surface Side of Diaphragm of Circuit Package and Opening FIG. 13 is a diagram illustrating a part of the cross-section taken along C-C in FIG. 10, and is an explanatory diagram illustrating a communication hole 676 that connects an air gap 674 provided inside the diaphragm 672 and the flow volume detection unit (flow volume detection element) 602 to a hole 520.

As will be described later, the flow volume detection unit (flow volume detection element) 602 for measuring the flow volume of the measurement target gas 30 forms an air gap on the back surface of the flow volume detection unit 602 such that the diaphragm is formed in the flow volume detection region of the flow volume detection element. Although not shown in the drawing, the diaphragm 672 is provided with elements that exchange heat with the measurement target gas 30 and thereby measuring the flow volume (such as a heat generating body 608, a resistance 652 and a resistance 654 as upstream-side temperature measurement resistors and a resistance 656 and a resistance 658 as downstream-side temperature measurement resistors). If heat is transferred between the elements formed on the diaphragm 672 via the diaphragm 672 separately from the heat exchange with the measurement target gas 30, it becomes difficult to precisely measure the flow volume. Therefore, it is necessary for the diaphragm 672 to have large heat resistance, and the diaphragm 672 is produced to have a minimum thickness. In the circuit package 400, a first plate 532 for forming a communication path is arranged on a second plate 536 corresponding to a lead. The chip-shaped flow volume detection unit 602 and the processing unit 604 that is produced as an LSI are mounted to the first plate 532. Each terminal of the flow volume detection unit 602 and the processing unit 604 are electrically connected to each other with the wire 542 via an aluminum pad. Furthermore, the processing unit 604 is connected to the second plate 536 with the wire 543 via an aluminum pad.

The flow volume detection unit (flow volume detection element) 602 is fixed so as to be buried in first resin of the circuit package 400 that is formed in the first resin-molding process such that the heat transfer surface 437 of the diaphragm 672 is exposed. The elements which are not shown in the drawing are provided on the surface of the diaphragm 672. The elements mutually perform heat transfer with the measurement target gas 30, which is not shown in the drawing, via the heat transfer surface 437 on the surface of the elements at the heat transfer surface exposed portion 436 corresponding to the diaphragm 672. The heat transfer surface 437 may be configured on the surfaces of the respective elements, or a thin protection film may be provided thereon. It is desirable that the heat transfer between the elements and the measurement target gas 30 is smoothly performed and direct heat transfer between the elements is minimized.

The portions, at which the elements are provided, of the flow volume detection unit (the flow detection element) 602 is arranged in the heat transfer surface exposed portion 436 on the measurement flow path surface 430, and the heat transfer surface 437 corresponding to the flow volume detection region is exposed from the resin that forms the measurement flow path surface 430. An outer circumferential portion of the flow volume detection unit 602 is covered with the thermosetting resin that is used in the first resin molding process for molding the measurement flow path surface 430. If only the side surface of the flow volume detection unit 602 is covered with the thermosetting resin and the front surface side of the outer circumferential portion of the flow volume detection unit 602 (that is, the region around the diaphragm 672) is not covered with the thermosetting resin, the stress that is caused in the resin forming the measurement flow path surface 430 is received only by the side surface of the flow volume detection unit 602, strain occurs in the diaphragm 672, and there is a concern that properties are degraded. By obtaining a state in which the front-side outer circumferential portion of the flow volume detection unit 602 is also covered with the thermosetting resin as illustrated in FIG. 13, the strain in the diaphragm 672 is reduced. In contrast, if a level difference between the heat transfer surface 437 and the measurement flow path surface 430 along which the measurement target gas 30 flows is large, the flow of the measurement target gas 30 is disturbed, and the measurement precision is degraded. Therefore, it is desirable that a level difference W between the heat transfer surface 437 and the measurement flow path surface 430 along which the measurement target gas 30 flows is small.

The diaphragm 672 is produced to have a significantly thin thickness in order to suppress the heat transfer between the elements, and the decrease in thickness is achieved by forming the air gap 674 on the back surface side of the flow volume detection unit 602. If the air gap 674 is tightly closed, the pressure in the air gap 674 formed on the back surface side of the diaphragm 672 varies based on a temperature due to variations in the temperature. If a pressure difference increases between the air gap 674 and the surface of the diaphragm 672, the diaphragm 672 receives a pressure and causes a strain, and it becomes difficult to perform the measurement with high precision. Therefore, the hole 520 that continues to the opening 438 that opens to the outside is provided in the plate 532, and a communication hole 676 that connects the hole 520 and the air gap 674 is provided. The communication hole 676 is configured of two plates, namely the first plate 532 and the second plate 536, for example. The first plate 532 is provided with the hole 520, a hole 521, and a groove for creating the communication hole 676. By blocking the groove, the hole 520, and the hole 521 with the second plate 536 from the back surface side of the first plate 532, the communication hole 676 is formed.

A communication path 440 that communicates the air gap 674 with the outside of the circuit package 400 is formed by the hole 521, the communication hole 676, and the hole 520 as described above. Specifically, the communication path 440 is configured of first to third communication paths, and the first communication path is a path that is formed along a thickness direction of the substrate, which is the first plate 532, from a communication port 521a continued to the air gap 674, and corresponds to the hole 521. The second communication path is a path that communicates with the first communication path and is formed along a direction intersecting the thickness of the substrate (the substantially orthogonal direction in the embodiment), and corresponds to the communication hole 676. Furthermore, the third communication path is a path that communicates the second communication path with the outside and is formed along the thickness direction of the substrate, and corresponds to the hole 520. By providing the communication path 440 as described above, pressures that act on the front surface and the back surface of the diaphragm 672 become substantially equal to each other, and the measurement precision is improved.

As described above, the communication port 521a of the communication path that communicates the air gap 674 of the flow volume detection unit 602 with the outside of the circuit package 400 is formed in the surface of the first plate (substrate) 532. The flow volume detection unit 602 is made to adhere via a paste adhesive made of thermosetting resin such as melamine, phenol, epoxy, or silicone such that the communication port 521a is covered with the air gap 674 of the flow volume detection unit 602 and an entire opening edge 674a of the air gap 674 is surrounded with an adhesive surface 532a. Conductive particles such as needle-shaped silver or copper particles may be further added to the paste adhesive to provide conductivity to the paste adhesive. In addition, the adhesive is not limited to the paste adhesive, and a tape-like adhesive with a predetermined thickness is also applicable.

Here, the adhesive 531 is applied to the first plate 532 in an adhesive application process when the flow volume detection unit 602 is mounted to the first plate (substrate) 532. Then, the flow volume detection unit 602 is installed on the first plate 532, to which the adhesive 531 has been applied, in an element installation process. In the element installed state, overmolding is performed with the first resin as described above, and the circuit package 400 is formed.

Although the communication hole 676 is created by blocking the groove, the hole 520, and the hole 521 with the second plate 536 as described above, it is possible to use a lead (lead frame) as the second plate 536 according to another method. The diaphragm 672 and the LSI that operates as the processing unit 604 are provided on the plate 532. The lead frame for supporting the plate 532, to which the diaphragm 672 and the processing unit 604 are mounted, is provided beneath these components. Therefore, the structure is more simplified by utilizing the lead frame. In addition, it is possible to use the lead frame as a ground electrode. By forming the communication hole 676 by providing the function of the second plate 536 to the lead frame, blocking the hole 520 and the hole 521 formed in the first plate 532 with the lead frame, and blocking the groove formed in the first plate 532 with the lead frame, it is possible to obtain a simple overall structure, and further to reduce influences of nose from the outside on the diaphragm 672 and the processing unit 604 by the action of the lead frame as the ground electrode.

Furthermore, in the circuit package 400, a pressing mark 442 remains on the back-side exposed surface 403 of the circuit package 400 in which the heat transfer surface exposed portion 436 is formed according to the embodiment. Flowing of the resin into the heat transfer surface exposed portion 436 is inhibited by molds by bringing a mold, such as a core piece, into contact with the portion corresponding to the heat transfer surface exposed portion 436 and bringing another mold to the portion corresponding to the pressing mark 442 on the opposite surface thereof in the first resin-molding process in order to prevent the resin from flowing into the heat transfer surface exposed portion 436. By forming the heat transfer surface exposed portion 436 as described above, it is possible to measure the flow volume of the measurement target gas 30 with significantly high precision.

FIG. 14 is an explanatory cross-sectional view illustrating an embodiment of a method of molding the circuit package in the first resin-molding process, where FIG. 14(A) illustrates a state before injecting the molding resin into a cavity of the mold, and FIG. 14(B) illustrates a state after the injection. FIG. 15 is an explanatory cross-sectional view illustrating a comparative example of the method of molding the circuit package, where FIG. 15(A) illustrates a state before the injection, and FIGS. 15(B) and 15(C) illustrates states after the injection.

The flow volume detection unit 602 is arranged in cavities of molds 701 and 702 in a state of adhering to the first plate 532 with the adhesive 531. Then, a mold 703 is pressed via an elastic film 705 such that the molding resin does not flow into the heat transfer surface exposed portion 436, and the heat transfer surface 437 of the diaphragm 672 is surrounded by an abutting portion 711 of the mold 703.

Here, if only the heat transfer surface 437 of the flow volume detection unit 602 is pressed with the mold 703 as illustrated in FIG. 15(A) of a comparative example, the adhesive at the pressed portion is compressed, the thickness thereof decreases as compared with the other portions as illustrated in FIG. 15(B), bending stress works on the flow volume detection unit 602, and the flow volume detection unit 602 is deformed in a direction in which the end 602b at a position separate from the heat transfer surface 437 floats from the plate 532. The bending stress that works on the flow volume detection unit 602 increases as pressing force of the mold 703 increases.

In a case in which all the thickness dimensions of the flow volume detection unit 602, the first plate 532, and the second plate 536 that are interposed between the molds 703 and 704 and the thickness of the adhesive 531 are in a range of lamination dimensional tolerance, for example, the elastic film 705 can absorb the pressing force of the mold 703, and the flow volume detection unit 602 is not damaged. However, if the flow volume detection unit 602 and the like exceed the range of the lamination dimensional tolerance due to an error or the like caused during fabrication and a limit of the absorption of the pressing force by the elastic film 705 is exceeded, there is a concern that excessive bending stress works on the flow volume detection unit 602. Since the flow volume detection unit 602 is a plate-shaped semiconductor chip, there is a possibility of deformation and breakage if the excessive bending stress works thereon.

In addition, if the adhesive 531 peels of due to the action of the bending stress, the end 602b of the flow volume detection unit 602 floats from the plate 532, and an air gap is formed between the flow volume detection unit 602 and the plate 532 as illustrated in FIG. 15(C), there is a possibility that flowing of a high-pressure resin into the air gap due to the transfer-molding causes excessive bending stress to work on the flow volume detection unit 602 and causes deformation or breakage thereof.

In contrast, according to the embodiment, the mold 703 is provided with an abutting portion 712 in addition to the abutting portion 711, and the abutting portion 712 is made to abut on the flow volume detection unit 602 as illustrated in FIGS. 14(A) and 14(B). The abutting portion 712 is made to abut on the pressed surface 602a on the surface of the flow volume detection unit 602 at a position separate from the heat transfer surface 437. The pressed surface 602a is set at a position between the short-side portion 602b that is a short side of the flow volume detection unit 602 at a furthest location from the heat transfer surface 437 and the heat transfer surface 437, and in this embodiment, the pressed surface 602a is set at a position in the vicinity of the short-side portion 602b.

Therefore, in the case of pressing the mold 703 against the flow volume detection unit 602, it is possible to press the flow volume detection unit 602 at multiple points while causing both the abutting portions 711 and 712 to abut on the surface of the flow volume detection unit 602, and to uniquely apply a load on the entire flow volume detection unit 602. Accordingly, excessive bending stress does not work on the flow volume detection unit 602 even if the flow volume detection unit 602 and the like exceeds the range of the lamination dimensional tolerance and the limit of the absorption of the pressing force by the elastic film 705 is exceeded. For this reason, it is possible to prevent the mold from applying non-uniform load to the flow volume detection unit 602 in the resin-molding process, and to prevent occurrence of deformation and breakage of the flow volume detection unit 602 due to the excessive bending stress working on the flow volume detection unit 602. In addition, since the resin-molding is performed in the state in which both the abutting portions 711 and 722 of the mold 703 are made to abut and are pressed, it is possible to prevent the adhesive 531 from peeling off, to prevent the short-side portion 602b of the flow volume detection unit 602 from floating from the plate 532, to prevent the air gap from being filled with the molding resin, and to prevent occurrence of deformation or breakage of the flow volume detection unit 602 due to the excessive bending stress working on the flow volume detection unit 602.

The pressing mark 439 is formed by the abutting portion 712 at the tip end that is exposed to the inside of the accessory path on the surface of the circuit package 400, and the pressed surface 602a is exposed as illustrated in FIG. 10(B). The pressed surface 602a can be provided with an inspection terminal 621 for inspecting an operation of the flow volume detection unit 602 as illustrated in FIG. 12, for example. Therefore, the inspection terminal 621 can inspect the operation of the flow volume detection unit 602 after the molding of the circuit package 400 or after the molding of the housing 302.

Although the above embodiment was described as the case in which the mold 703 is provided with the two abutting portions 711 and 712 and the flow volume detection unit 602 is pressed therewith, a plurality of abutting portions may be further provided. Alternatively, the mold 703 may be provided with a single abutting portion that abuts on the area between the heat transfer surface 437 and the pressed surface 602a and the flow volume detection unit 602 may be pressed therewith, and in such a case, the heat transfer surface 437 and the pressed surface 602a are formed into a connecting shape. In the case in which the mold 703 is provided with the single abutting portion that abuts on the area between the heat transfer surface 437 and the pressed surface 602a, dimensional precision of the mold increases, and it is possible to prevent the load applied to the flow volume detection unit (semiconductor chip) 602 via the elastic film 705 from being unbalanced. In addition, since the area to which the load of the mold is applied via the elastic film 705 expands in a wide range, it is possible to qualitatively reduce risks of occurrence of the bending stress.

FIG. 16 is an exemplary cross-sectional view illustrating another embodiment and corresponds to a cross-sectional view taken along line C-C in FIG. 10.

According to the embodiment, a moisture detection unit is formed on the pressed surface 602a that is exposed by the pressing mark 439. That is, the flow volume detection unit 602 that is a semiconductor chip also includes the moisture detection unit. The pressed surface 602a is formed by a semiconductor diaphragm of the moisture detection unit. The semiconductor diaphragm can be obtained by forming an air gap 675 on the back surface side of the flow volume detection unit 602. If the air gap is tightly closed, the semiconductor diaphragm is deformed due to variations in the pressure in the air gap, which is caused by variations in the temperature, and the measurement precision is degraded. Therefore, the opening 438 that communicates with the air gap on the back surface side of the semiconductor diaphragm is provided in the surface of the circuit package 400, and the communication path connecting the air gap on the back surface side of the semiconductor diaphragm and the opening 438 is provided inside the circuit package 400 in the embodiment.

FIG. 17 is an explanatory cross-sectional view illustrating another embodiment, and corresponds to a cross-sectional view taken along line C-C in FIG. 10.

According to the embodiment, the flow volume detection unit 602 and the processing unit 604 are configured in a single semiconductor chip 605. That is, the semiconductor chip 605 includes the flow volume detection unit 602 and the processing unit 604.

The semiconductor chip 605 is resin-molded in a state in which the mold 703 is pressed against the heat transfer surface 437 provided on the surface of the semiconductor chip 605 and the pressed surface 602a that is set on the surface of the semiconductor chip 605 at a position separate from the heat transfer surface 437. In doing so, the pressing mark 439 is formed by the abutting portion 712 at a position exposed to the inside of a circuit chamber on the surface 400a of the circuit package 400, and the pressed surface 602a is exposed.

According to the embodiment, it is possible to press both the heat transfer surface 437 that is provided on the surface of the semiconductor chip 605 and the pressed surface 602a that is set on the surface of the semiconductor chip 605 at the position separate from the heat transfer surface 437 in a case of pressing the flow volume detection unit 602 with the mold 703, and to thereby apply a uniform load to the entire semiconductor chip 605. Since the processing unit 604 is provided between the pressed surface 602a and the heat transfer surface 437 and there is a distance therebetween in the embodiment, in particular, the short-side portion 602b easily floats when only the heat transfer surface 437 is pressed. However, it is possible to effectively prevent the short-side portion 602b from floating by pressing both the heat transfer surface 437 and the pressed surface 602a.

Therefore, excessive bending stress does not work on the flow volume detection unit 602 even in the case in which the flow volume detection unit 602 and the like exceed the range of the lamination dimensional tolerance and the limit of the absorption of the pressing force by the elastic film 705 is exceeded. Therefore, it is possible to prevent the mold 703 from applying a non-uniform load to the semiconductor chip 605 in the resin-molding process and to prevent deformation or breakage of the semiconductor chip 605 from occurring due to the excessive bending stress working thereon. In addition, since the resin-molding is performed in a state of being pressed with the mold 703, it is possible to prevent the adhesive 531 from peeling off, to prevent the short-side portion 605b at an end side, which is located at the furthest position from the heat transfer surface 437, of the semiconductor chip 605 from floating from the plate 532, to prevent the gap thereof from being filled with the molding resin, and to prevent deformation and breakage from occurring due to the excessive bending stress working on the semiconductor chip 605.

FIG. 18 illustrates a state in which the frame including the lead made of metal is molded with thermosetting resin in the first resin molding process and the frame is covered with the thermosetting resin. By the molding, the measurement flow path surface 430 is formed on the surface of the circuit package 400, and the heat transfer surface exposed portion 436 is provided in the measurement flow path surface 430. In addition, the air gap 674 on the back surface side of the diaphragm 672 corresponding to the heat transfer surface exposed portion 436 has a configuration of continuing to the opening 438. The temperature detection unit 452 for measuring the temperature of the measurement target gas 30 is provided at the tip end of the projection 424, and a temperature detection element 518 is built therein. A lead for extracting an electrical signal from the temperature detection element 518 is discontinued to suppress heat transfer, and a connection line 546 with high heat resistance is arranged in the projection 424. In doing so, the heat transfer from the root of the projection 424 to the temperature detection unit 452 is suppressed, and an influence of the heat is suppressed.

Furthermore, an inclined portion 594 and an inclined portion 596 are created at the root of the projection 424. There is an effect that flow of the resin used in the first resin-molding process becomes smooth, and there is also an effect that the measurement target gas 30 after being measured by the temperature detection unit 452 smoothly flows from the projection 424 to the root thereof due to the inclined portion 594 and the inclined portion 596 in a state of being mounted to a vehicle and operated, the root of the projection 424 is cooled, and the influence of the heat on the temperature detection unit 452 can be reduced. After the state illustrated in FIG. 18, the lead 514 is cut into each terminal and forms the connection terminal 412 and the terminal 414.

In the first resin-molding process, it is necessary to prevent the resin from flowing into the heat transfer surface exposed portion 436 and the opening 438. Therefore, core pieces that are greater than the diaphragm 672, for example, are brought into contact with the positions of the heat transfer surface exposed portion 436 and the opening 438 for inhibiting the flowing of the resin thereinto, and pressing pieces are brought into contact with the back surfaces thereof so as to pinch the heat transfer surface exposed portion 436 and the opening 438 from both surfaces. In FIG. 10(C), the pressing mark 442 and the pressing mark 441 remain on the back surface 400*b* so as to correspond to the heat transfer surface exposed portion 436 and the opening 438 in FIG. 19 or the heat transfer surface exposed portion 436 and the opening 438 in FIG. 10(B).

If the cut surface of the lead after being cut from the frame 512 as illustrated in FIG. 18 is exposed from the resin surface, there is a concern that moisture or the like enter the inside from the cut surface of the lead during usage. It is important to prevent such situation from a viewpoint of improving durability and from a viewpoint of improving reliability. The lead cut portions at the inclined portion 594 and the inclined portion 596, for example, are covered with resin in the second resin-molding process, and the lead cut surfaces are covered with the resin. In doing so, corrosion of the lead cut surfaces and entrance of water from the cut portions are prevented. The lead cut surfaces are located near the important lead portion that delivers an electrical signal from the temperature detection unit 452. Therefore, it is desirable to cover the cut surfaces in the second resin-molding process.

6. Production Process of Thermal Type Flowmeter 300

6.1 Production Process of Circuit Package 400

FIGS. 19 and 20 illustrate a production process of the thermal type flowmeter 300, where FIG. 19 illustrates a production process of the circuit package 400 and FIG. 20 illustrates a production process of the thermal type flowmeter. In FIG. 19, Step 1 is a process of producing a frame made of metal. The frame is produced by press working, for example.

In Step 2, the plate 532 is mounted to the frame that is produced in Step 1 first, the flow volume detection unit 602 and the processing unit 604 are then mounted to the plate 532, and circuit components such as the temperature detection element 518 and the chip capacitor are further mounted thereto. In Step 2, electrical wiring is connected between the circuit components, between the circuit components and the leads, and between the leads. In Step 2, the lead 544 and the lead 548 are connected with the connection line 546 for increasing the heat resistance. In Step 2, the circuit components are mounted to the frame, and an electric circuit including further electrical connection is produced.

Then, in Step 3, molding with the thermosetting resin is performed in the first resin-molding process. The state will be illustrated in FIG. 18. In Step 3, the connected leads are respectively cut from the frame, and leads connected to each other are also cut, and the circuit package 400 illustrated in FIG. 10 is completed. In the circuit package 400, the measurement flow path surface 430 and the heat transfer surface exposed portion 436 are formed as illustrated in FIG. 10.

In Step 4, an appearance inspection and an operation inspection of the completed circuit package 400 are conducted. Since the high-temperature resin is injected into the mold at a high pressure while the electric circuit produced in Step 2 is fixed inside the mold in the first resin-molding process in Step 3, it is desirable to inspect whether or not any failures have occurred in the electric components or the electric wiring. For the inspection, the terminal 414 is used in addition to the connection terminal 412 illustrated in FIG. 10. Since the terminal 414 is not used thereafter, the terminal 414 may be cut from the root thereof after the inspection.

6.2 Production Process and Property Correction of Thermal Type Flowmeter 300

In the process illustrated in FIG. 20, the circuit package 400 that is produced as illustrated in FIG. 19 and the external terminal 306 are used, and the housing 302 is produced in the second resin-molding process in Step 5. The accessory path grooves, the flange 312, and the external connection portion 305 of the housing 302 are produced, the hatched portion of the circuit package 400 illustrated in FIG. 10 is covered with the resin used in the second resin-molding process, and the circuit package 400 is fixed to the housing 302. By the combination of the production of the circuit package 400 in the first resin-molding process (Step 3) and the formation of the housing 302 of the thermal type flowmeter 300 in the second resin-molding process, the flow volume detection precision is greatly improved. Each external terminal inner end is cut in Step 6, and the connection terminal and the external terminal inner end are connected in Step 7.

If the housing 302 is completed in Step 7, the front cover 303 and the back cover 304 are then attached to the housing 302 in Step 8, the inside of the housing 302 is tightly closed with the front cover 303 and the back cover 304, and the accessory paths to cause the measurement target gas 30 to flow therethrough are completed. Furthermore, the area-reduced structure illustrated in FIG. 7 is produced by the protrusion 356 that is provided at the front cover 303 or the back cover 304. The front cover 303 is produced by molding in Step 10, and the back cover 304 is produced by molding in Step 11. In addition, the front cover 303 and the back cover 304 are respectively produced in different processes by molding using different molds.

In Step 9, gas is guided into the accessory paths in practice, and a property test is conducted. Since the relationship between the accessory paths and the flow volume detection unit is maintained with high precision as described above, it is possible to achieve significantly high measurement precision by performing property correction based on the property test. Since positioning and shape formation that determine the relationship between the accessory paths and the flow volume detection unit are performed in the first resin-molding process and the second resin-molding process, less variations occur in properties even after usage for a long period of time, and high precision and high reliability are secured.

7. Circuit Configuration of Thermal Type Flowmeter 300

7.1 Overall Circuit Configuration of Thermal Type Flowmeter 300

FIG. 21 is a circuit diagram illustrating the flow volume detection circuit 601 of the thermal type flowmeter 300. Although the measurement circuit related to the temperature detection unit 452 that was described above in the embodiment is also provided in the thermal type flowmeter 300, the measurement circuit is omitted in FIG. 21. The flow volume detection circuit 601 of the thermal type flowmeter 300 is provided with the flow volume detection unit 602 including the heat generating body 608 and the processing unit 604. The processing unit 604 controls the amount of heat generation by the heat generating body 608 of the flow volume detection unit 602 and outputs a signal indicating the flow volume based on an output from the flow volume detection unit 602 via the terminal 662. In order to perform the processing, the processing unit 604 is provide with a Central Processing Unit (hereinafter, referred to as a CPU) 612, an input circuit 614, an output circuit 616, a memory 618 that holds data indicating relationships of correction values, measurement values, and flow volumes, and a power circuit 622 that supplies a constant voltage to circuits that require the voltage. A DC power is supplied from an external power source such as an in-vehicle battery to the power circuit 622 via the terminal 664 and the ground terminal which is not shown in the drawing.

The flow volume detection unit 602 is provided with the heat generating body 608 for heating the measurement target gas 30. A voltage V1 is supplied from the power circuit 622 to a collector of a transistor 606 that configures a current supply circuit of the heat generating body 608, a control signal is provided from the CPU 612 to a base of the transistor 606 via the output circuit 616, and a current is supplied from the transistor 606 to the heat generating body 608 via the terminal 624 based on the control signal. The amount of the current to be supplied to the heat generating body 608 is controlled based on the control signal that is provided from the CPU 612 to the transistor 606, which configures the current supply circuit of the heat generating body 608, via the output circuit 616. The processing unit 604 controls the amount of heat generation by the heat generating body 608 such that the temperature of the measurement target gas 30 is raised by a predetermine temperature, for example, 100° C. from an initial temperature by being heated by the heat generating body 608.

The flow volume detection unit 602 includes a heat generation control bridge 640 for controlling the amount of heat generation by the heat generating body 608 and a flow volume detection bridge 650 for measuring the flow volume. A constant voltage V3 is supplied from the power circuit 622 to one end of the heat generation control bridge 640 via the terminal 626, and the other end of the heat generation control bridge 640 is connected to the ground terminal 630. In addition, a constant voltage V2 is supplied from the power circuit 622 to one end of the flow volume detection bridge 650 via the terminal 625, and the other end of the flow volume detection bridge 650 is connected to the ground terminal 630.

The heat generation control bridge 640 includes a resistance 642 which is a temperature measurement resistor with a resistance value that varies based on the temperature of the heated measurement target gas 30, and the resistance 642, the resistance 644, the resistance 646, and the resistance 648 configure a bridge circuit. A potential difference between an intersection A of the resistance 642 and the resistance 646 and an intersection B of the resistance 644 and the resistance 648 is input to the input circuit 614 via the terminal 627 and the terminal 628, and the CPU 612 controls the amount of heat generation by the heat generating body 608 by controlling the current to be supplied from the transistor 606 such that the potential difference between the intersection A and the intersection B becomes a predetermined value, in this embodiment, 0 V. In the flow volume detection circuit 601 illustrated in FIG. 21, the heat generating body 608 heats the measurement target gas 30 to always raise the temperature by a constant temperature, for example, 100° C., from the original temperature of the measurement target gas 30. In order to control the heating with high precision, resistance values of the respective resistances that configure the heat generation control bridge 640 are set such that the potential difference between the intersection A and the intersection B becomes 0 V when the temperature of the measurement target gas 30 heated by the heat generating body 608 is raised by a predetermine temperature, for example, always 100° C. from the original temperature of the measurement target gas 30. Therefore, in the flow volume detection circuit 601 illustrated in FIG. 21, the CPU 612 controls the current to be supplied to the heat generating body 608 such that the potential difference between the intersection A and the intersection B becomes 0 V.

The flow volume detection bridge 650 is configured of four temperature measurement resistors, namely the resistance 652, the resistance 654, the resistance 656, and the resistance 658. The four temperature measurement resistors are arranged along the flow of the measurement target gas 30, the resistances 652 and the resistance 654 are arranged on the upstream side of the flow path of the measurement target gas 30 relative to the heat generating body 608, and the resistances 656 and the resistances 658 are arranged on the downstream side of the flow path of the measurement target gas 30 relative to the heat generating body 608. In order to improve the measurement precision, the resistance 652 and the resistance 654 are arranged such that distances to the heat generating body 608 therefrom are substantially equal to each other, and the resistance 656 and the resistance 658 are arranged such that distances to the heat generating body 608 therefrom are substantially equal to each other.

A potential difference between an intersection C of the resistance 652 and the resistance 656 and an intersection D of the resistance 654 and the resistance 658 is input to the input circuit 614 via a terminal 631 and a terminal 632. In order to improve the measurement precision, the respective resistances of the flow volume detection bridge 650 are set such that the potential difference between the intersection C and the intersection D becomes zero in a state in which flow of the measurement target gas 30 is zero. Therefore, in a case in which the potential difference between the intersection C and the intersection D is, for example, 0 V, the CPU 612 outputs an electrical signal indicating that the flow volume in the main path 124 is zero from the terminal 662 based on the measurement result indicating that the flow volume of the measurement target gas 30 is zero.

In a case in which the measurement target gas 30 flows in the arrow direction in FIG. 21, the resistance 652 and the resistance 654 that are arranged on the upstream side are cooled by the measurement target gas 30, the resistance 656 and the resistance 658 that are arranged on the downstream side of the measurement target gas 30 are warmed by the measurement target gas 30 that is warmed by the heat generating body 608, and the temperatures of the resistance 656 and the resistance 658 rise. Therefore, a potential difference occurs between the intersection C and the intersection ID in the flow volume detection bridge 650, and the potential difference is input to the input circuit 614 via the terminal 631 and the terminal 632. The CPU 612 searches for data that indicates a relationship between the potential difference and the flow volume in the main path 124, which is stored on the memory 618, based on the potential difference between the intersection C and the intersection D in the flow volume detection bridge 650, and obtains the flow volume in the main path 124. An electrical signal that indicates the thus obtained flow volume in the main path 124 is output via the terminal 662. Although the reference numerals are newly provided to the terminal 664 and the terminal 662 in FIG. 21, the terminal 664 and the terminal 662 are included in the connection terminal 412 described above with reference to FIGS. 5 and 6.

The memory 618 stores the data indicating the relationship of the potential difference between the intersection C and the intersection D and the flow volume in the main path 124, and stores correction data for reducing measurement errors, such as variations, that are obtained from actual measurement values of the gas after production of the circuit package 400. The actual measurement of the gas after the production of the circuit package 400 and writing of the correction value based on the actual measurement in the memory 618 are performed by using the external terminal 306 and the correction terminal 307 illustrated in FIG. 4. Since the circuit package 400 is provided in a state in which the arrangement relationship between the accessory paths, through which the measurement target gas 30 is made to flow, and the measurement flow path surface 430 and the arrangement relationship between the accessory paths, through which the measurement target gas 30 is made to flow, and the heat transfer surface exposed portion 436 are controlled with high precision such that at least significantly less variations are included in the embodiment, it is possible to obtain a significantly precise measurement result by the correction using the correction value.

7.2 Configuration of Flow Volume Detection Circuit 601

FIG. 22 is a circuit configuration diagram illustrating circuit arrangement of the aforementioned flow volume detection circuit 601 in FIG. 21. The flow volume detection circuit 601 is produced as a semiconductor chip with a rectangular shape, and the measurement target gas 30 flows in the arrow direction from the left side to the right side of the flow volume detection circuit 601 illustrated in FIG. 22.

The diaphragm 672 with a rectangular shape that is obtained by thinning the thickness of a semiconductor chip is formed in the flow volume detection unit (flow volume detection element) 602 that is configured of the semiconductor chip, and the diaphragm 672 is provided with a thin thickness region (that is, the aforementioned heat transfer surface) 603 that is represented by the broken line. The aforementioned air gap is formed on the back surface side of the thin thickness region 603, the air gap communicates with the opening 438 illustrated in FIGS. 10 and 5, and the pressure in the air gap depends on the pressure of the air guided from the opening 438.

Heat conductivity decreases by thinning the thickness of the diaphragm 672, heat transfer to the resistance 652, the resistance 654, the resistance 658, and the resistance 656 that are provided in the thin thickness region (heat transfer surface) 603 of the diaphragm 672 via the diaphragm 672 is suppressed, and the temperatures of the resistances are substantially determined by the heat transfer with the measurement target gas 30.

The heat generating body 608 is provided at the center of the thin thickness region 603 of the diaphragm 672, and the resistance 642 that configures the heat generation control bridge 640 is provided around the heat generating body 608. In addition, the resistances 644, 646, and 648 that configure the heat generation control bridge 640 are provided outside the thin thickness region 603. The heat generation control bridge 640 is configured of the thus formed resistances 642, 644, 646, and 648.

In addition, the resistance 652 and the resistance 654 as the upstream-side temperature measurement resistors and the resistance 656 and the resistance 658 as the downstream-side temperature measurement resistors are arranged so as to interpose the heat generating body 608, the resistance 652 and the resistance 654 as the upstream-side temperature measurement are arranged on the upstream side of the arrow direction, in which the measurement target gas 30 flows, relative to the heat generating body 608, and the resistance 656 and the resistance 658 as the downstream-side temperature measurement resistors are arranged on the downstream side of the arrow direction, in which the measurement target gas 30 flows, relative to the heat generating body 608. As described above, the resistance 652 and the resistance 654 that are arranged in the thin thickness region 603 and the resistance 656 and the resistance 658 form the flow volume detection bridge 650.

In addition, both ends of the heat generating body 608 are connected to the terminals 624 and 629 that are illustrated on the lower side in FIG. 22, respectively. Here, a current to be supplied from the transistor 606 to the heat generating body 608 is applied to the terminal 624, and the terminal 629 is grounded as illustrated in FIG. 21.

The resistance 642, the resistance 644, the resistance 646, and the resistance 648 that configure the heat generation control bridge 640 are respectively connected to the terminals 626 and 630. As illustrated in FIG. 21, the constant voltage V3 is supplied from the power circuit 622 to the terminal 626, and the terminal 630 is grounded. In addition, a connection point between the resistance 642 and the resistance 646 and a connection point between the resistance 646 and the resistance 648 are connected to the terminal 627 and the terminal 628. As illustrated in FIG. 22, the terminal 627 outputs a potential at the intersection A between the resistance 642 and the resistance 646, and the terminal 627 outputs a potential at the intersection B between the resistance 644 and the resistance 648. As illustrated in FIG. 21, the constant voltage V2 is supplied from the power circuit 622 to the terminal 625, and the terminal 630 is grounded as a ground terminal. In addition, the connection point between the resistance 654 and the resistance 658 are connected to the terminal 631, and the terminal 631 outputs a potential at the point B in FIG. 21. The connection point between the resistance 652 and the resistance 656 is connected to the terminal 632, and the terminal 632 outputs a potential at the intersection C illustrated in FIG. 21.

Since the resistance 642 that configures the heat generation control bridge 640 is formed in the vicinity of the heat generating body 608 as illustrated in FIG. 22, it is possible to precisely measure the temperature of the gas that is warmed by the heat generation by the heat generating body 608. In contrast, since the resistances 644, 646, and 648 that configure the heat generation control bridge 640 are arranged so as to be separate from the heat generating body 608, the resistances 644, 646, and 648 are configured so as not to be easily influenced by the heat generation by the heat generating body 608. The resistance 642 is configured to sensitively respond to the temperature of the gas that is warmed by the heat generating body 608, and the resistance 644, the resistance 646, and the resistance 648 are configured so as not to be easily influenced by the heat generating body 608. For this reason, the precision in detecting the measurement target gas 30 by the heat generation control bridge 640 is high, and it is possible to precisely control the measurement target gas 30 to raise the temperature thereof by a predetermined temperature from the initial temperature.

In the embodiment, the air gap is formed on the back surface side of the diaphragm 672, the air gap communicates with the opening 438 illustrated in FIGS. 10 and 5 such that a difference between the pressure in the air gap on the back surface side of the diaphragm 672 and the pressure on the front side of the diaphragm 672 does not increase. Strain of the diaphragm 672 due to the pressure difference can be suppressed. This results in an improvement in the flow volume measurement precision.

As described above, the thin thickness region 603 is formed in the diaphragm 672, the thickness of the portion including the thin thickness region 603 is significantly reduced, and heat transfer via the diaphragm 672 is suppressed as much as possible. Therefore, the influence of the heat transfer via the diaphragm 672 on the flow volume detection bridge 650 and the heat generation control bridge 640 is suppressed, a tendency of operations depending on the temperature of the measurement target gas 30 is further enhanced, and the measurement operation is improved. Therefore, it is possible to achieve high measurement precision.

INDUSTRIAL APPLICABILITY

The present invention can be applied to the aforementioned measurement apparatus for measuring a flow volume of gas.

REFERENCE SIGNS LIST

30: measurement target gas
124: main path
300: thermal type flowmeter
302: housing
303: front cover
304: back cover
305: external connecting portion
306: external terminal
307: correction terminal
310: measurement unit
320: terminal connecting portion
332: front-side accessory path groove
334: back-side accessory path groove
356: protrusion
359: resin portion
361: external terminal inner end
372: fixing portion
400: circuit package
402: front-side exposed surface (exposed surface)
412: connection terminal
414: terminal
424: projection
430: measurement flow path surface
432: fixed surface
434: fixed surface
436: heat transfer surface exposed portion
437: heat transfer surface
438: opening
452: temperature detection unit
461: guide unit
461A: upstream guide unit
461B: downstream guide unit
462, 463: depressed groove portion
464, 465: convexity
466: concavity
467: convexity
531: adhesive
532: first plate (substrate)
536: second plate
542: wire
590: press-fitting hole
594: inclined portion
596: inclined portion
601: flow volume detection circuit
602: flow volume detection unit (semiconductor chip)
602a: pressed surface
604: processing unit
608: heat generating body
623: terminal
640: heat generation control bridge
650: flow volume detection bridge
672: diaphragm
701, 702, 703, 704: mold

The invention claimed is:

1. A method of manufacturing a thermal type flowmeter that includes a circuit package of a resin-molded semiconductor chip, the method comprising:
   resin-molding a semiconductor chip in a state in which a mold is pressed against a heat transfer surface that is provided on a surface of the semiconductor chip and a pressed surface that is set on the surface of the semiconductor chip at a position separate from the heat transfer surface.

2. The method of manufacturing a thermal type flowmeter according to claim 1,
   wherein the pressed surface is set at a position between an edge that is located at the furthest position from the heat transfer surface of the semiconductor chip and the heat transfer surface.

3. The method of manufacturing a thermal type flowmeter according to claim 1,
   wherein the heat transfer surface continues to the pressed surface.

4. The method of manufacturing a thermal type flowmeter according to claim 1,
   wherein a substrate to which the semiconductor chip is mounted is provided; and
   wherein the semiconductor chip is configured such that a back surface of the semiconductor chip is fixed to the substrate with an adhesive interposed between the semiconductor chip and the substrate.

5. The method of manufacturing a thermal type flowmeter according to claim 1,
   wherein a processing unit that is mounted to the substrate along with the semiconductor chip is provided, and
   wherein the semiconductor chip is provided with two separate sets of a plurality of terminals that are electrically connected to the processing unit via wires, and the pressed surface is set at a position between the two sets of terminals.

6. The method of manufacturing a thermal type flowmeter according to claim 5,
   wherein an inspection terminal of the semiconductor chip is provided on the pressed surface.

7. The method of manufacturing a thermal type flowmeter according to claim 1,
   wherein the semiconductor chip includes a flow volume detection unit, and wherein the heat transfer surface is formed of a diaphragm of the flow volume detection unit.

8. The method of manufacturing a thermal type flowmeter according to claim 1,
wherein the semiconductor chip includes a moisture detection unit, and
wherein the pressed surface is formed of a diaphragm of the moisture detection unit.

9. The method of manufacturing a thermal type flowmeter according to claim 1,
wherein the semiconductor chip includes a flow volume detection unit and a processing unit.

* * * * *